United States Patent
Ansari et al.

(10) Patent No.: US 11,182,110 B1
(45) Date of Patent: Nov. 23, 2021

(54) ON-CHIP MEMORY BLOCK CIRCUIT

(71) Applicant: Xilinx, Inc., San Jose, CA (US)

(72) Inventors: Ahmad R. Ansari, San Jose, CA (US); Sagheer Ahmad, Cupertino, CA (US)

(73) Assignee: Xilinx, Inc., San Jose, CA (US)

(*) Notice: Subject to any disclaimer, the term of this patent is extended or adjusted under 35 U.S.C. 154(b) by 191 days.

(21) Appl. No.: 16/547,550

(22) Filed: Aug. 21, 2019

(51) Int. Cl.
| | |
|---|---|
| G06F 3/06 | (2006.01) |
| H03K 19/17728 | (2020.01) |
| G11C 5/14 | (2006.01) |
| G11C 7/22 | (2006.01) |
| G11C 11/4076 | (2006.01) |
| G06F 5/06 | (2006.01) |
| G06F 13/16 | (2006.01) |
| G06F 1/3206 | (2019.01) |
| G11C 7/24 | (2006.01) |
| H03K 19/173 | (2006.01) |

(52) U.S. Cl.
CPC .......... *G06F 3/0683* (2013.01); *G06F 1/3206* (2013.01); *G06F 3/0604* (2013.01); *G06F 3/0655* (2013.01); *G06F 5/06* (2013.01); *G06F 13/16* (2013.01); *G11C 5/14* (2013.01); *G11C 5/148* (2013.01); *G11C 7/222* (2013.01); *G11C 7/225* (2013.01); *G11C 7/24* (2013.01); *G11C 11/4076* (2013.01); *H03K 19/17728* (2013.01); *H03K 19/1738* (2013.01)

(58) Field of Classification Search
CPC ...... G06F 3/0683; G06F 1/3206; G06F 13/16; G06F 5/06; G06F 3/0604; G06F 3/0655; G11C 5/14; G11C 7/24; G11C 7/225; G11C 11/4076; G11C 7/222; G11C 5/148; H03K 19/17728; H03K 19/1738
USPC .......................................................... 365/233.1
See application file for complete search history.

(56) References Cited

U.S. PATENT DOCUMENTS

| 10,424,363 | B2* | 9/2019 | Uemura | .............. G11C 11/4087 |
| 2005/0268058 | A1* | 12/2005 | Drasnin | .............. G06F 12/1466 |
| | | | | 711/163 |
| 2008/0137601 | A1* | 6/2008 | Sung | .................. H04W 28/065 |
| | | | | 370/329 |

(Continued)

FOREIGN PATENT DOCUMENTS

| CN | 100412736 C | * | 8/2008 |
| CN | 108022329 A | * | 5/2018 |

OTHER PUBLICATIONS

"UltraRAM: Breakthrough Embedded Memory Integration on UltraScale+ Devices," Xilinx, Inc., White Paper WP477 (v1.0) Jun. 14, 2016, © Copyright 2016 Xilinx, Inc., San Jose, California USA, 11 pg.

(Continued)

*Primary Examiner* — Fernando Hidalgo
(74) *Attorney, Agent, or Firm* — Kevin T. Cuenot

(57) ABSTRACT

A memory block circuit can include a plurality of data interfaces, a switch connected to each data interface of the plurality of data interfaces, and a plurality of memory banks each coupled to the switch. Each memory bank can include a memory controller and a random access memory connected to the memory controller. The memory block circuit also includes a control interface and a management controller connected to the control interface and each memory bank of the plurality of memory banks. Each memory bank can be independently controlled by the management controller.

20 Claims, 10 Drawing Sheets

(56) References Cited

U.S. PATENT DOCUMENTS

2011/0202704 A1*  8/2011  Seo .................... G06F 13/1673
                                                    711/5
2019/0340153 A1* 11/2019  Sity ................... G06F 11/1616

OTHER PUBLICATIONS

Bilski et al., "Device With Data Processing Engine Array", U.S. Appl. No. 15/944,307, filed Apr. 3, 2018, 123 pages.

Swarbrick et al., "Configurable Network-On-Chip for a Programmable Device", U.S. Appl. No. 16/041,473, filed Jul. 20, 2018, 34 pages.

"Xilinx Al Engines and Their Applications," Xilinx, Inc., White Paper WP506 (v1.0.2), Oct. 3, 2018, Xilinx, Inc., San Jose, California, USA, 13 pg.

Versal: The First Adaptive Compute Acceleration Platform (ACAP), Xilinx, Inc. White Paper WP505 (v1.0), Oct. 2, 2018, Xilinx, Inc., San Jose, California, USA, 21 pg.

"Versal Architecture and Product Data Sheet: Overview," Xilinx, Inc., Datasheet DS950 (v1.0), Oct. 2, 2018, Xilinx, Inc., San Jose, California, USA, 23 pg.

* cited by examiner

ON-CHIP MEMORY BLOCK CIRCUIT

TECHNICAL FIELD

This disclosure relates to integrated circuits (ICs) and, more particularly, to an on-IC, or "on-chip," memory block circuit that may be accessed by multiple, different circuits of the IC.

BACKGROUND

Integrated circuits (ICs) can be implemented to perform a variety of functions. Some ICs can be programmed to perform specified functions. One example of an IC that can be programmed is a field programmable gate array (FPGA). An FPGA includes programmable logic that is often implemented as an array of programmable tiles. These programmable tiles may include, for example, input/output blocks (IOBs), configurable logic blocks (CLBs), dedicated random access memory blocks (BRAM), multipliers, and digital signal processing blocks (DSPs).

Some programmable ICs have evolved to include programmable logic in combination with one or more other subsystems. For example, some programmable ICs, often referred to as System-on-Chips or "SoCs," include both programmable logic and a hardwired processor.

SUMMARY

In one aspect, a memory block circuit can include a plurality of data interfaces, a switch connected to each data interface of the plurality of data interfaces, and a plurality of memory banks each coupled to the switch. Each memory bank includes a memory controller and a random access memory connected to the memory controller. The memory block circuit also can include a control interface and a management controller. The management controller is connected to the control interface and to each memory bank of the plurality of memory banks. Each memory bank is independently controllable by the management controller.

In another aspect, a device includes a processor system having a core configured to execute program code. The device can include a programmable logic configurable to implement different user-specified circuits. The device also can include a memory block circuit directly connected to the processor system and the programmable logic. The programmable logic and the processor system are configured to access the memory block circuit concurrently.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
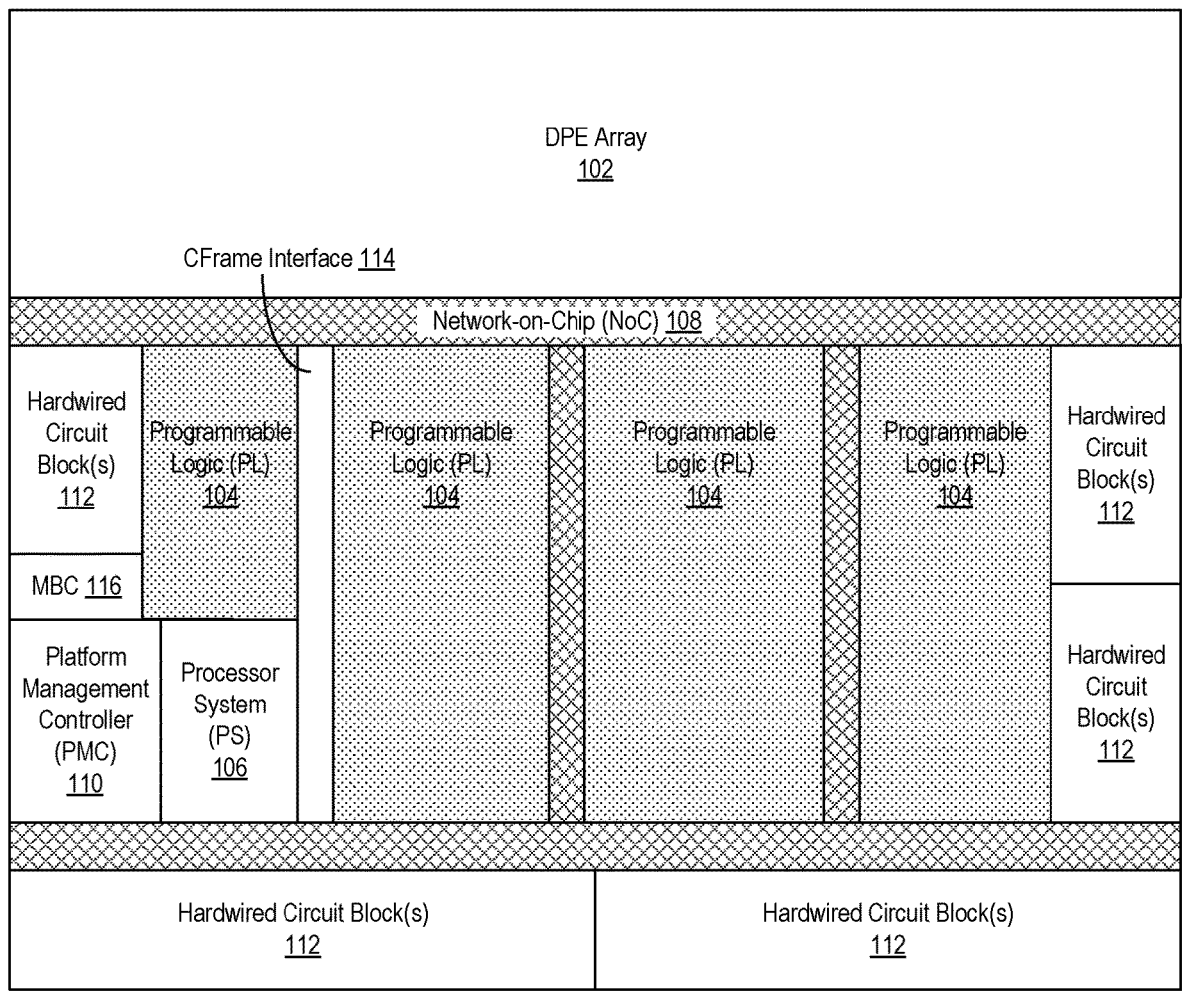
FIG. 1 illustrates an example architecture for a System-on-Chip (SoC) type of integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to an on-IC, or "on-chip," memory block circuit that may be accessed by multiple, different circuits of the IC. In accordance with the inventive arrangements described within this disclosure, the memory block circuit may be implemented to include multiple interfaces and include multiple memory banks. With this structure, the memory block circuit is capable of supporting concurrent access by two or more different circuits of the IC. Each circuit, for example, may be directly connected to a different one of the multiple interfaces of the memory block circuit. The circuits connected to the memory block circuit may access the memory block circuit concurrently by accessing different memory banks therein.

In one aspect, an IC including the memory block circuit may include one or more subsystems. Examples of these subsystems include a processing system (PS), programmable logic (PL), and/or a data processing engine (DPE) array. Two or more (or all) of these subsystems can be directly connected to the memory block circuit through the interfaces of the memory block circuit. With the direct connections, the memory block circuit may be used to accelerate operation of applications implemented using the different subsystems of the IC.

For purposes of illustration, consider a Computational Neural Network (CNN) implemented using the DPE array. The CNN may also have supporting circuitry implemented within the PL of the IC. Operation of the CNN and the supporting circuitry typically requires a high-bandwidth and low latency storage mechanism. The example memory block circuit described within this disclosure is capable of meeting these requirements. The memory block circuit may be directly connected to the PL and/or to the PS through high bandwidth, low latency interfaces.

In such a configuration, the example memory block circuit is capable of storing weights for the CNN and/or storing image data that may be operated on by the CNN. In some cases, the memory block circuit may be used to supplement operation of an off-chip random access memory (RAM such as, e.g., a DDR memory) that may be used to store weights and/or image data for the CNN. Use of the memory block circuit alone or in combination with an off-chip RAM results in faster retrieval of the data and faster operation of the CNN.

Unlike other memory resources included within the PL, e.g., Block Random Access Memory (BRAM) or Ultra RAM (URAM), the example memory block circuit described herein includes interface circuitry and control circuitry. As such, a designer does not have to create interface circuitry or control circuitry from PL resources for the memory block circuit in order to incorporate the memory block circuit into a design for the IC as is the case when using BRAM or URAM. Creation of interface and control circuitry may be particularly complex when dual-port (e.g., multi-port) memory architectures are desired.

In another aspect, the memory block circuit may be large enough in terms of data storage capacity to store the entire application, e.g., program code, executed by one or more of the subsystems of the IC. By storing the entire code base for a particular subsystem or processing unit on the IC, the need for external RAM is reduced or eliminated, thereby reducing latency of the design as implemented in the IC, improving low-power operation of the IC, and improving operation of standby modes in the IC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture for a System-on-Chip (SoC) 100. SoC 100 is an example of a programmable IC and an adaptive system. In the example of FIG. 1, the various, different subsystems or regions of SoC 100 illustrated may be implemented on a single die provided within a single integrated package. In other examples, the different subsystems may be implemented on a plurality of interconnected dies provided as a single, integrated package.

In the example, SoC 100 includes a plurality of regions having circuitry with different functionalities. SoC 100 optionally includes a data processing engine (DPE) array 102. SoC 100 includes PL 104, a PS 106, an optional Network-on-Chip (NoC) 108, a PMC 110, and optionally one or more hardwired circuit blocks 112.

DPE array 102 is implemented as a plurality of interconnected, hardwired, and programmable processors, e.g., an array of DPEs, having an interface to the other regions of the SoC 100. The DPEs within DPE array 102 are hardwired. Each DPE of DPE array 102 includes one or more cores and dedicated memory. The core of a DPE is capable of accessing the memory within the same DPE and the memory of any other DPE that is adjacent to the core of the DPE in the up, down, left, and right directions. The core of a DPE sees each of these memories as a unified region of memory. This facilitates data sharing among DPEs.

The DPEs of DPE array 102 are interconnected by programmable interconnect circuitry allowing groups of one or more DPEs to be arranged in a group or cluster. For example, the interconnect circuitry may include a configuration network for configuring each DPE (e.g., providing instructions for execution and/or data), a programmable stream network that allows different DPEs in DPE array 102 to communicate using packetized data (e.g., not establishing connectivity on a per-bit basis as is the case with PL 104), and a debug network that allows debug information to be obtained.

The configuration network allows configuration data, e.g., instructions for execution by each DPE, stream switch programming establishing logical links between DPEs, etc., to be loaded into DPE array 102. Each DPE may have different program code to implement one or more different kernels therein. In another aspect, cores of DPEs in the same row may be directly connected by cascade interfaces with a core of an edge DPE of a row being directly connected to a core of another edge DPE in a different row immediately above or below.

PL 104 is circuitry that may be programmed to perform specified functions. As an example, PL 104 may be implemented as field programmable gate array type of circuitry. PL 104 can include an array of programmable circuit blocks. As defined herein, the term "programmable logic" means circuitry used to build reconfigurable digital circuits. Programmable logic is formed of many programmable circuit blocks sometimes referred to as "tiles" that provide basic functionality. The topology of PL 104 is highly configurable unlike hardwired circuitry. Each programmable circuit block of PL 104 typically includes a programmable element (e.g., a functional element) and a programmable interconnect. The programmable interconnects provide the highly configurable topology of PL 104. The programmable interconnect may be configured on a per wire basis to provide connectivity among the programmable circuit blocks of PL 104 and is configurable on a per-bit basis (e.g., where each wire conveys a single bit of information) unlike connectivity among DPEs, for example.

Examples of programmable circuit blocks of PL 104 include configurable logic blocks having look-up tables and registers. Unlike hardwired circuitry described below and sometimes referred to as hard blocks, these configurable logic blocks have an undefined function at the time of manufacture. PL 104 may include other types of programmable circuit blocks that have also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 104, are numerous and intermingled with the other programmable circuit blocks of PL 104.

Prior to use, PL 104, e.g., the programmable interconnect and the programmable elements, must be programmed or "configured" by loading data referred to as a configuration bitstream into internal configuration memory cells therein. The configuration bitstream may be generated by defining the functionality to be implemented in PL 104 using a hardware description language (HDL) such as Verilog and/or VHDL and synthesizing the HDL description to the architecture of PL 104. The configuration bitstream will specify the values of the configuration memory cells in PL 104 that specify the look-up tables that define the basic logical functions, their combination, and their connectivity and/or topology. Within this disclosure, a "configuration bitstream" is not equivalent to program code executable by a processor or computer.

CFrame interface (CFI) 114 is an interface through which configuration data, e.g., a configuration bitstream, may be provided to PL 104 to implement different user-specified circuits and/or circuitry therein. CFI 114 further may be used to initialize memory that is included within PL 104. CFI 114 is accessible by PMC 110 to provide configuration data to PL 104 and to perform memory initialization as described. In some cases, PMC 110 is capable of first configuring PS 106 such that PS 106, once configured by PMC 110, may provide configuration data to PL 104.

PS 106 is implemented as hardwired circuitry that is fabricated as part of SoC 100. PS 106 may be implemented as, or include, any of a variety of different processor types each capable of executing program code. For example, PS 106 may be implemented as an individual processor, e.g., a single core capable of executing program code. In another example, PS 106 may be implemented as a multi-core processor. In still another example, PS 106 may include one or more cores, modules, co-processors, interfaces, controllers, and/or other resources. PS 106 may be implemented using any of a variety of different types of architectures. Example architectures that may be used to implement PS 106 may include, but are not limited to, an ARM processor architecture, an x86 processor architecture, a graphics processing unit (GPU) architecture, a mobile processor architecture, a DSP architecture, or other suitable architecture that is capable of executing computer-readable instructions or program code.

NoC 108 is an interconnecting network for sharing data between endpoint circuits in SoC 100. The endpoint circuits can be disposed in DPE array 102, PL 104, PS 106, and/or in hardwired circuit blocks 112. NoC 108 can include high-speed data paths with dedicated switching. In an example, NoC 108 includes one or more horizontal paths, one or more vertical paths, or both horizontal and vertical path(s). The arrangement and number of regions shown in FIG. 1 is merely an example. NoC 108 is an example of the common infrastructure that is available within SoC 100 to connect selected components and/or subsystems.

NoC 108 provides connectivity to PL 104, PS 106, and to selected ones of hardwired circuit blocks 112. NoC 108 is programmable. In the case of a programmable NoC used with SoC 100, the nets that are to be routed through NoC 108 are unknown until a user circuit design is created for implementation within SoC 100. NoC 108 may be programmed by loading configuration data into internal configuration registers that define how elements within NoC 108 such as switches and interfaces are configured and operate to pass data from switch to switch and among the NoC interfaces to connect the endpoint circuits.

NoC 108 is fabricated as part of SoC 100 and while not physically modifiable, may be programmed to establish connectivity between different master circuits and different slave circuits of a user circuit design. NoC 108, upon power-on, does not implement any data paths or routes therein. Once configured by PMC 110, however, NoC 108 implements data paths or routes between endpoint circuits. NoC 108, for example, may include a plurality of programmable switches that are capable of establishing a packet switched network connecting user specified master circuits and slave circuits. In this regard, NoC 108 is capable of adapting to different circuit designs, where each different circuit design has different combinations of master circuits and slave circuits implemented at different locations in SoC 100 that may be coupled by NoC 108. NoC 108 may be programmed to route data, e.g., application data and/or configuration data, among the master and slave circuits of the user circuit design. For example, NoC 108 may be programmed by PMC 110 to couple different user-specified circuitry together whether implemented using PL 104, PS 106, and/or DPE array 102. Further, NoC 108 is capable of coupling user-specified circuitry with different hardwired circuit blocks 112 and/or with different circuits and/or systems external to the SoC 100.

Hardwired circuit blocks 112 are special-purpose circuit blocks fabricated as part of SoC 100. Hardwired circuit blocks 112, also referred to as "hard blocks," are effectively application-specific ICs embedded in SoC 100 that present a predetermined functionality such as Peripheral Component Interconnect Express (PCIe), memory controller, or the like. Hardwired circuit blocks 112 are typically more complex in functionality compared to programmable circuit blocks in PL 104. In addition, there are typically fewer hardwired circuit blocks 112 in SoC 100 compared to programmable circuit blocks, or tiles, of PL 104.

Though hardwired, hardwired circuit blocks 112 may be configured by loading configuration data into control registers to implement one or more different modes of operation. In this sense, hardwired circuit blocks 112 may be programmed, but typically only in the context of the functionality offered by each respective hardwired circuit block. For example, hardwired circuit blocks 112 may be programmed within the memory space to which each hardwired circuit block 112 is mapped or through the architectural registers that each respective hardwired circuit block 112 has through the existing interfaces to the blocks.

Examples of hardwired circuit blocks 112 may include input/output (I/O) blocks, transceivers for sending and receiving signals to circuits and/or systems external to SoC 100, memory controllers, and video encoders. Examples of different I/O blocks may include single-ended and pseudo differential I/Os. Examples of transceivers may include high-speed differentially clocked transceivers. Other examples of hardwired circuit blocks 112 include, but are not limited to, cryptographic engines, digital-to-analog converters (DACs), and analog-to-digital converters (ADCs).

Memory block circuit 116 is a hardwired circuit block that has a plurality of interfaces (e.g., ports) and includes a plurality of memory banks. The various memory banks of memory block circuit 116 are independently controllable. Using the multiple interfaces and multiple memory banks, two or more circuits in SoC 100 may access memory block circuit 116 concurrently. The plurality of interfaces include a plurality of data interfaces and a control interface. One or more of the data interfaces may be directly connected to PL 104. The control interface may be directly connected to PL 104 and/or to PS 106 or particular components within PS 106.

In the example of FIG. 1, PL 104 is shown in four separate regions. In another example, PL 104 may be implemented as a unified region of programmable circuitry. In still another example, PL 104 may be implemented as more than four different regions of programmable circuitry or fewer than four different regions of programmable circuitry. The particular organization of PL 104 is not intended as a limitation. In this regard, SoC 100 includes PL 104 having one or more regions, PS 106, and PMC 110. NoC 108 may be included. DPE array 102 may also be included.

In other example implementations, SoC 100 may include two or more DPE arrays 102 located in different regions of the IC. In still other examples, SoC 100 may be implemented as a multi-die IC. In one example, each subsystem may be implemented on a different die. In another example, one or more or all subsystems may be replicated across each die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include a single subsystem, two or more subsystems, a subsystem and another partial subsystem, or any combination thereof. In one example implementation, each die may include a PMC, where the PMC implemented in a die designated as "master" is the master PMC while PMCs implemented in other dies designated as slaves operate as slave PMCs coupled to the master PMC.

Figure 2:
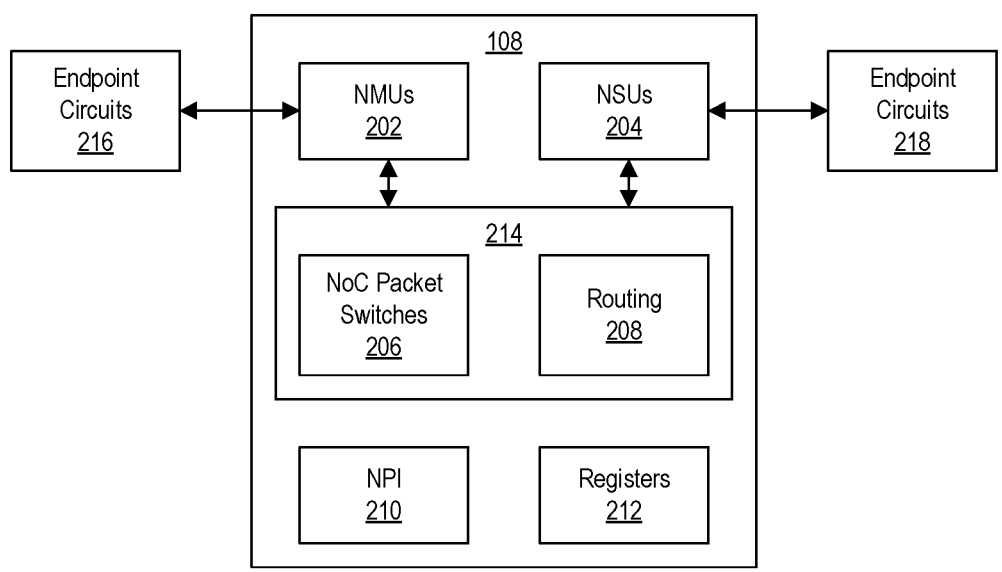
FIG. 2 illustrates an example implementation of the Network-on-Chip (NoC) of FIG. 1.

FIG. 2 illustrates an example implementation of NoC 108. NoC 108 includes NoC master units (NMUs) 202, NoC slave units (NSUs) 204, a network 214, NoC peripheral interconnect (NPI) 210, and registers 212. Each NMU 202 is an ingress circuit that connects an endpoint circuit to the NoC 108. Each NSU 204 is an egress circuit that connects the NoC 108 to an endpoint circuit. The NMUs 202 are connected to the NSUs 204 through network 214. In an example, network 214 includes NoC packet switches 206 (NPSs) and routing 208 between NPSs 206. Each NPS 206 performs switching of NoC packets. NPSs 206 are connected to each other and to NMUs 202 and NSUs 204 through routing 208 to implement a plurality of physical channels. NPSs 206 also support multiple virtual channels per physical channel.

NPI 210 includes circuitry to program NMUs 202, NSUs 204, and NPSs 206. For example, NMUs 202, NSUs 204, and NPSs 206 can include registers 212 that determine functionality thereof. NPI 210 includes a peripheral interconnect coupled to registers 212 for programming thereof to set functionality. Registers 212 in NoC 108 support interrupts, Quality of Service (QoS), error handling and reporting, transaction control, power management, and address mapping control. Registers 212 can be initialized in a usable state before being reprogrammed, such as by writing to registers 212 by PMC 110 using write requests. Configuration data for NoC 108 can be stored in a non-volatile memory (NVM), e.g., as part of a programming device image (PDI), and provided to NPI 210 for programming NoC 108 and/or other endpoint circuits.

NMUs 202 are traffic ingress points. NSUs 204 are traffic egress points. Endpoint circuits coupled to NMUs 202 and NSUs 204 can be hardened circuits (e.g., hardwired circuit blocks 112), circuits implemented in PL 104, and/or circuitry in DPE array 102. A given endpoint circuit can be coupled to more than one NMU 202 or more than one NSU 204.

In the example, endpoint circuits 216 are connected to endpoint circuits 218 through NoC 108. Endpoint circuits 216 are master circuits, which are coupled to NMUs 202 of NoC 108. Endpoint circuits 218 are slave circuits coupled to NSUs 204 of NoC 108. Each endpoint circuit 216 and 218 can be a circuit in PS 106, a circuit in PL 104, or a circuit in another subsystem (e.g., hardwired circuit blocks 112 and/or in DPE array 102).

Network 214 includes a plurality of physical channels. The physical channels are implemented by programming NoC 108. Each physical channel includes one or more NPSs 206 and associated routing 208. An NMU 202 connects with an NSU 204 through at least one physical channel. A physical channel can also have one or more virtual channels.

Connections through network 214 use a master-slave arrangement. In an example, the most basic connection over network 214 includes a single master connected to a single slave. However, in other examples, more complex structures can be implemented.

As shown in the example of FIG. 1, NoC 108 may include one or more vertical portions referred to as vertical NoCs or "VNoCs" and one or more horizontal portions referred to as "HNoCs". Each VNoC is disposed between regions of PL 104. The HNoCs are generally disposed between the regions of PL 104 and hardwired circuit blocks 112 or between the regions of PL 104 and DPE array 102. NoC 108 may be connected to memory interfaces (e.g., other hardwired circuit blocks 112). PS 106 may be coupled to the HNoC.

In one example, PS 106 includes a plurality of NMUs 202 coupled to the HNoC. The VNoC includes both NMUs 202 and NSUs 204, which are disposed in PL 104. Certain hardwired circuit blocks 112, e.g., memory interfaces, include NSUs 204 coupled to the HNoC. Both the HNoC and the VNoC include NPSs 206 connected by routing 208. In the VNoC, routing 208 extends vertically. In the HNoC, the routing 208 extends horizontally. In each VNoC, each NMU 202 is coupled to an NPS 206. Likewise, each NSU 204 is coupled to an NPS 206. NPSs 206 are coupled to each other to form a matrix of switches. Some NPSs 206 in each VNoC are coupled to other NPSs 206 in the HNoC.

NoC 108 may be programmed and/or used as part of a larger boot or programming process or programmed independently of other subsystems in SoC 100. In general, programming NoC 108 may include PMC 110 receiving NoC programming data at boot time. The NoC programming data may be a part of a PDI. PMC 110 is responsible for managing SoC 100. PMC 110 is capable of maintaining a safe and secure environment, booting SoC 100, and managing SoC 100 during normal operation.

PMC 110 loads the NoC programming data to registers 212 through NPI 210 to create physical channels. In an example, the programming data can also include information for configuring routing tables in NPSs 206. PMC 110 further boots SoC 100. In this manner, NoC 108 includes at least configuration information for the physical channels between NMUs 202 and NSUs 204. Remaining configuration information for NoC 108 can be received during runtime, as described further below. In another example, all or a portion of the configuration information described below as being received during runtime can be received at boot time.

In terms of runtime, PMC 110 is capable of receiving NoC programming data during runtime. PMC 110 loads the programming data to registers 212 through the NPI 210. In an example, PMC 110 configures routing tables in NPSs 206. PMC 110 configures QoS paths over the physical channels. PMC 110 configures address space mappings. PMC 110 configures ingress/egress interface protocol, width, and frequency.

Figure 3:
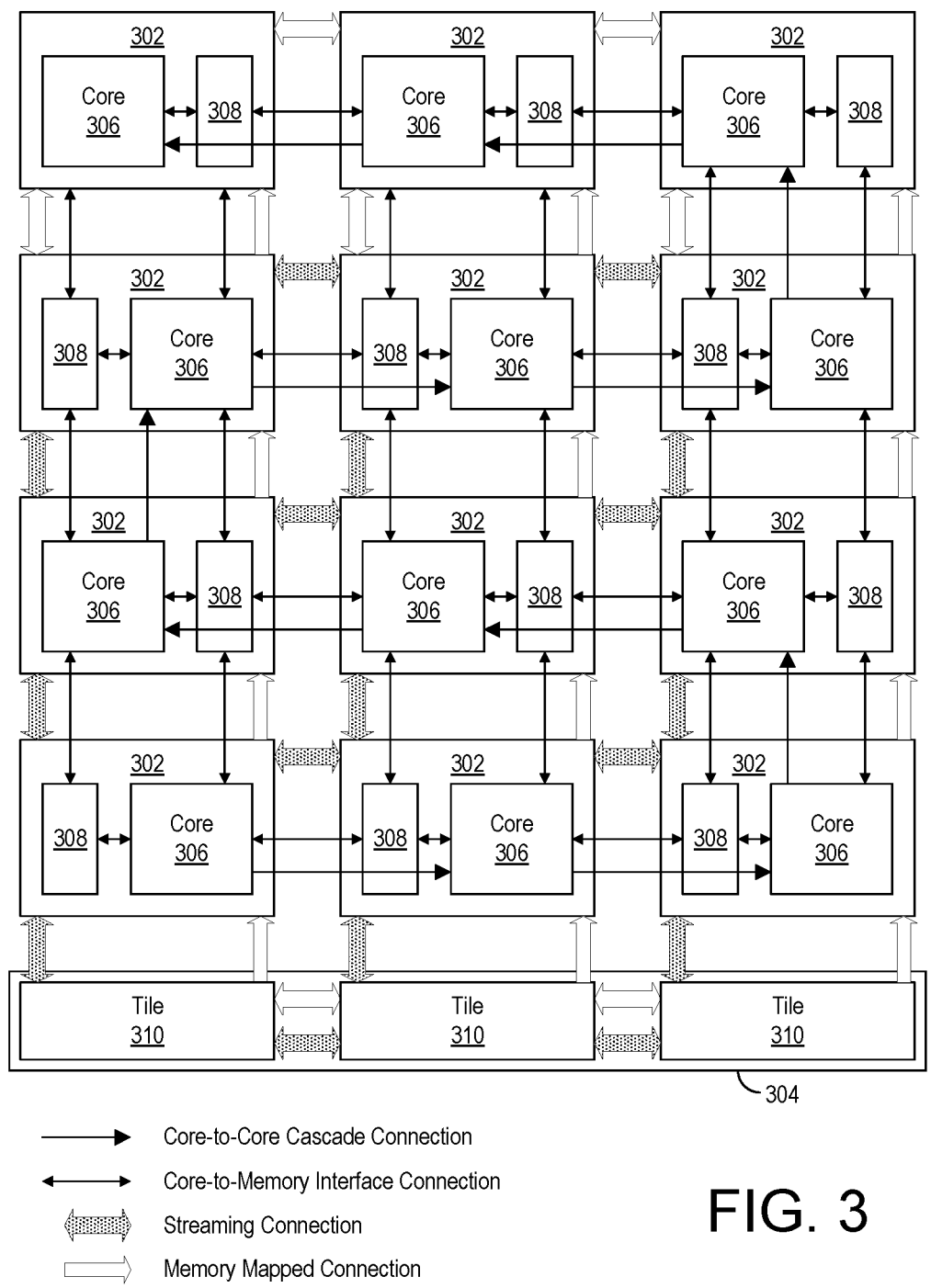
FIG. 3 illustrates an example implementation of the Data Processing Engine (DPE) array of FIG. 1.

FIG. 3 illustrates an example implementation of DPE array 102. In the example of FIG. 3, DPE array 102 is implemented as a two-dimensional array of DPEs 302 that includes an SoC interface block 304. DPEs 302 and SoC interface block 304 are hardwired and programmable. DPE array 102 may be implemented using any of a variety of different architectures. For purposes of illustration and not limitation, FIG. 3 illustrates DPEs 302 arranged in aligned rows and aligned columns. In the example, DPEs 302 are arranged where DPEs in selected rows are horizontally inverted or flipped relative to DPEs in adjacent rows. In one or more other embodiments, rows and/or columns of DPEs 302 may be offset relative to adjacent rows and/or columns. In the example, each DPE 302 includes a core 306 and a memory module 308. Each core 306 is capable of accessing data from an adjacent memory module whether in the same DPE 302 or in another DPE 302. The number of DPEs 302, particular arrangement of DPEs 302, and/or orientation of DPEs 302 is not intended to be limiting.

DPEs 302 are interconnected by a DPE interconnect network. The DPE interconnect network includes core-to-memory interface connections, core-to-core cascade connections, streaming connections, and memory mapped connections. The DPE interconnect network may also include an independent debug network and/or an independent event broadcast network (neither of which are not shown).

SoC interface block 304, which is also hardwired and programmable) is capable of coupling DPEs 302 to one or more other subsystems of SoC 100. In one or more embodiments, SoC interface block 304 is coupled to adjacent DPEs 302. For example, SoC interface block 304 may be directly coupled to each DPE 302 in the bottom row of DPEs in DPE array 102. SoC interface block 304 is capable of communicating with any DPE 302 of DPE array 102 by communicating with one or more selected DPEs 302 of DPE array 102 directly connected to SoC interface block 304 and utilizing the DPE interconnect network formed of various configurable switches (not shown) included in each respective DPE 302. SoC interface block 304 is capable of coupling each DPE 302 within DPE array 102 with one or more other subsystems of SoC 100. For example, SoC interface block 304 is capable of coupling to DPE array 102 to NoC 108 and to PL 104. As such, DPE array 102 (e.g., selected DPEs 302) is capable of communicating with circuit blocks implemented in PL 104, PS 106, and/or any of the hardwired circuit blocks 112.

Cores 306 provide the data processing capabilities of DPEs 302. Each core 306 may be implemented as any of a variety of different processing circuits. In an example implementation, each core 306 is implemented as a processor that is capable of executing program code, e.g., computer readable instructions. In that case, each core 306 may include a program memory that may only be accessed by the particular core in which the program memory is disposed. The program memory in each core 306 and is capable of storing instructions that are executed by the respective core 306. Core 306, for example, may be implemented as a CPU, a GPU, a DSP, a vector processor, or other type of processor that is capable of executing instructions. Core 306 may be implemented using any of the various CPU and/or processor architectures described herein. In another example, core 306 is implemented as a very long instruction word (VLIW) vector processor or DSP.

Cores 306 and memory modules 308 may be controlled by way of configuration data loaded into registers in the respective DPEs 302. For example, each core 306 and/or memory 308 may be activated and/or deactivated based upon configuration data loaded into the registers. The registers and memory modules 308 are addressable (e.g., may be read and/or written) via the memory mapped connections of the DPE interconnect network by certain masters in SoC 100. For example, PMC 110 is capable of reading and/or writing to any memory within DPE array 102 that is addressable using the memory mapped connections of the DPE interconnect network.

In one or more embodiments, memory modules 308 are capable of storing data that is used by and/or generated by any adjacent core 306. For example, memory modules 308 may include read/write memories such as a random-access memory (RAM). Accordingly, memory modules 308 are capable of storing data that may be read and consumed by cores 306. Memory modules 308 are also capable of storing data (e.g., results) that are written by cores 306. Each memory module 308 may be directly read or written by the core 306 that is immediately adjacent in the up, down, left, and right directions (e.g., the four cardinal directions). Thus, unless a core 306 is within a DPE 302 on an edge column or edge row, the core 306 is capable of directly accessing the memory module 308 within the same DPE 302 and the memory module of three other neighboring and adjacent DPEs 302—the DPEs 302 having a memory module 308 immediately adjacent to the core 306. The direct memory accesses are performed by way of the core-to-memory interface connections. Each core 306 is capable of viewing the memory modules 308 that the core is capable of accessing (e.g., four memory modules composed of the memory module within the same DPE and the memory modules of three other DPEs) as a single, contiguous memory (e.g., as a single address space). This allows DPEs 302 (e.g., the cores 306) to also communicate via shared memories.

DPE array 102 may be programmed by loading configuration data into registers (not shown) within each DPE 302 that define connectivity among DPEs 302 and SoC interface block 304 and how DPEs 302 and SoC interface block 304 operate. For example, for a particular DPE 302 or group of DPEs 302 to communicate with a subsystem, the DPE(s) 302 and SoC interface block 304 are programmed to do so. Similarly, for one or more particular DPEs 302 to communicate with one or more other DPEs 302, the DPEs are programmed to do so. The configuration data indicates whether the DPEs 302 communicate via stream connections or using core-to-core cascade connections.

In the example of FIG. 3, streaming connections, core-to-core cascade connections (direct core-to-core connections), and core-to-memory interface connections facilitate the exchange of application data among DPEs 302. The memory mapped connections facilitate the exchange of configuration data, control data, debugging data, and the like.

The streaming connections may be implemented by including one or more stream switches in each DPE 302. The stream switches are interconnected. For example, each stream switch may include ports that connect to the other DPEs 302 in the four cardinal directions and include ports that connect to circuit structures in the same DPE 302 (e.g., the core 306, the memory module 308 via one or more direct memory access circuits, and a memory mapped switch in the same DPE 302). The streaming connections allow neighboring DPEs 302 and non-neighboring DPEs 302 to communicate. In general, the stream switches may be programmed to operate as a circuit-switching stream interconnect or a packet-switched stream interconnect. A circuit-switching stream interconnect is capable of implementing point-to-point, dedicated streams that are suitable for high-bandwidth communication among DPEs 302. A packet-switching stream interconnect allows streams to be shared to time-multiplex multiple logical streams onto one physical stream for medium bandwidth communication. Operation of the stream switches may be controlled by writing to the previously described registers via the memory mapped connection (e.g., created using the memory mapped switches).

The memory mapped connections may be implemented by including one or more memory mapped switches in each DPE 302. Each memory mapped switch may include a plurality of memory mapped interfaces. For example, each memory mapped switch in a DPE 302 may include interfaces for connecting to the memory mapped switch in the DPE 302 above and the memory mapped switch in the DPE 302 below (or the tile 310 below) and interfaces for connecting to circuit structures in the same DPE 302 such as the core 306 including the program memory, memory module 308, and the stream switch (for configuration thereof). The memory mapped connections are used to convey configuration, control, and debugging data for DPE array 102.

DPE array 102 may be mapped to the address space of a processor system such as PS 106 or PMC 110. Accordingly, any configuration registers and/or memories within a DPE 302 or within SoC interface block 304 may be accessed via a memory mapped interface. For example, memory in memory module 308, program memory, and registers may be read and/or written via memory mapped connections. Thus, using the memory mapped connections, program code may be written to cores 306, DPEs 302, data may be read or written to memory modules 308, streaming connections between DPEs 302 may be established, etc.

Cores 306 are further capable of communicating directly with adjacent cores 306 via core-to-core cascade connections. Core-to-core cascade connections are unidirectional or bidirectional direct connections between cores as pictured in FIG. 3. Each core 306, for example, may include a cascade interface connected to an adjacent core as illustrated. The cascade interface may be connected to an internal accumulation register of the core 306 so that internal data within core 306 loaded into the accumulation register may be sent (e.g., streamed) to another adjacent core 306. Core-to-core cascade connections may be programmed based upon configuration data loaded into the registers of the DPEs 302. For example, based upon configuration data loaded into the registers, input cascade interfaces and output cascade interfaces for each core may be activated or deactivated independently and on a per-core basis.

In an example implementation, DPEs 302 do not include cache memories. By omitting cache memories, DPE array 102 is capable of achieving predictable, e.g., deterministic, performance. Further, significant processing overhead is avoided since maintaining coherency among cache memories located in different DPEs is not required. In a further example, cores 306 of DPEs 302 do not have input interrupts. Thus, cores 306 of DPEs 302 are capable of operating uninterrupted. Omitting input interrupts to cores 306 of DPEs 302 also allows DPE array 102 to achieve predictable, e.g., deterministic, performance.

SoC interface block 304 includes a plurality of interconnected tiles 310 organized in a row. In particular embodiments, different architectures may be used to implement tiles within SoC interface block 304 where each different tile architecture supports communication with a different type of subsystem or combination of subsystems of SoC 100. Tiles 310 are coupled so that data may be propagated from one tile to another bi-directionally. Each tile 310 is capable of operating as an interface for the column of DPEs 302 above.

For example, each tile 310 is capable of receiving data from another source such as PS 106, PL 104, and/or another hardwired circuit block 112, e.g., an application-specific IC or "ASIC" block. Tile 310 is capable of providing those portions of the data addressed to DPEs in the column above to such DPEs 302 while sending data addressed to DPEs in other columns on to other tiles 310 so that such tiles may route the data addressed to DPEs 302 in their columns accordingly. In this manner, data may propagate from tile to tile of SoC interface block 304 until reaching the tile that operates as an interface for the DPEs to which the data is addressed (e.g., the "target DPE(s)"). The tile that operates as an interface for the target DPE(s) is capable of directing the data to the target DPE(s) using the memory mapped switches of the DPEs (e.g., for configuration) and/or the stream switches of the DPEs (e.g., for application data).

In one aspect, SoC interface block 304 includes two different types of tiles 310. A first type of tile 310 has an architecture configured to serve as an interface between DPEs 302 and only PL 104. A second type of tile 310 is has an architecture configured to serve as an interface between DPEs 302 and NoC 108 and between DPEs and PL 104. SoC interface block 304 may include a combination of tiles of the first and second types or tiles of only the second type.

The first type of tile 310 may include a stream switch connected to a PL interface and to a DPE 302 immediately above. The PL interface connects to Boundary Logic Interface (BLI) circuits located in PL 104. The second type of tile 310 includes a stream switch connected to a NoC and PL interface and to a DPE 302 immediately above. The NoC and PL interface connects to BLI circuits in PL 104 and also to one or more NMUs 202 and one or more NSUs 204 of NoC 108.

Tiles 310 include stream switches and memory mapped switches. Stream switches in adjacent tiles 310 are connected. Memory mapped switches in adjacent tiles 310 are connected. As discussed, stream switches establish streaming connections that convey application data while memory mapped switches establish memory mapped connections that convey configuration, control, and/or debug data. Regarding DPE array 102, application data is data that is operated on by cores 306. Configuration data is data used to program components of DPEs 302 such as stream switches, cores 306, and may include program code for cores 306. Stream switches in each tile 310 are connected to the stream switch in the DPE 302 immediately above. Similarly, memory mapped switches in each tile 310 are connected to the memory mapped switch in the DPE immediately above.

DPE array 102 may be programmed initially as part of a boot process for SoC 100. During runtime, DPE array 102 may be reconfigured. Thus, PMC 110 is capable of initially configuring DPE array 102 to establish which of DPEs 302 are connected to one another and/or to other subsystems or circuits, implement kernels in DPEs 302, to load program code, and the like. At any point during runtime, PMC 110 may reconfigure all or a portion of DPE array 102 by establishing different connections between DPEs 302 and/or with different subsystems or circuits, implement different kernels in DPEs 302, to load different program code, and the like.

DPE array 102 is also capable of generating various events. Events generated by DPE array 102 may be routed globally to other subsystems of SoC 100. For example, selected events generated by DPE array 102 may be routed to PMC 110 to indicate a detected error within DPE array 102. In another example, selected events may be routed to PMC 110 and/or PS 106 and serviced as interrupts.

Figure 4:
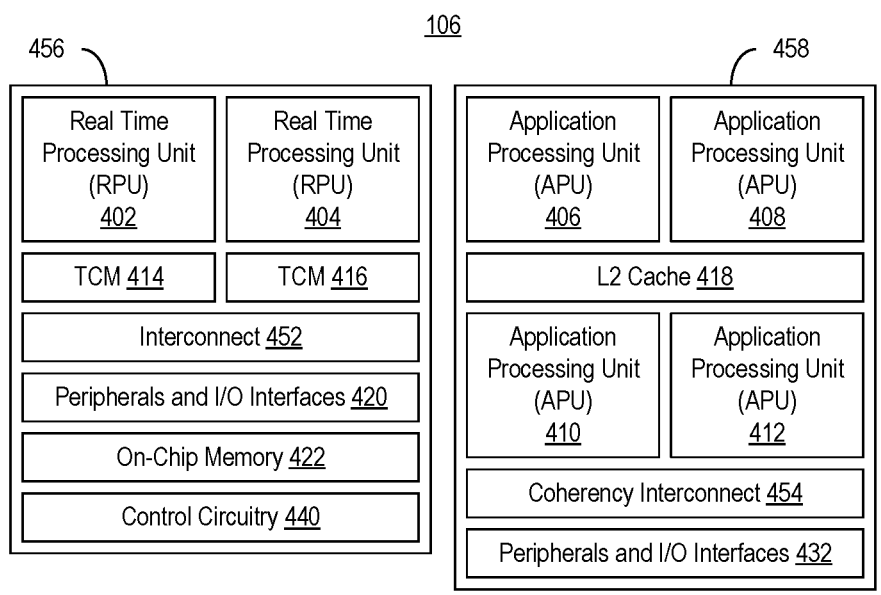
FIG. 4 illustrates an example implementation of the processor system of FIG. 1.

FIG. 4 illustrates an example implementation of PS 106 of FIG. 1. PS 106 is implemented as a hard-wired subsystem. In the example, PS 106 includes a plurality of processors capable of executing program code and a plurality of peripherals and I/O interfaces. In one aspect, PS 106 includes two separate power domains 456 and 458. Each power domain may be powered by a different power supply.

Within this disclosure, the term "power domain," used in reference to SoC 100, means a set of components of SoC 100 that are powered by a same or common set of power rails. In one aspect, each different subsystem is an example of a power domain. Thus, in one aspect, power domains within SoC 100 include PL 104, PS 106, NoC 108, and selected ones of hardwired circuit blocks 112. As discussed, PS 106 may include two different power domains. Power domains, e.g., the powering on and/or off thereof, are managed by PMC 110, which may be configured to control an off-chip voltage regulator that provides power to the different power rails included in SoC 100. PMC 110 may turn power domains on and off independently of one another.

As such, power domains 456 and 458 are powered by different power supply rails within SoC 100 and may be powered on or off (or placed in a lower power or hibernate mode) independently of the other power domain under control of PMC 110. For example, power domain 456 may continue to operate using real time processing units (RPUs) while power domain 458, including application processing units (APUs), is powered off. In one aspect, memory block circuit 116 of FIG. 1 is part of power domain 456.

Power domain 456 includes RPUs 402 and 404. RPUs 402 and 404 each may include a level-1 (L1) cache (not shown) and a tightly coupled memory (TCM) interface 414, 416 where, for example, TCM 414 corresponds to RPU 402 and TCM 416 corresponds to RPU 404. In the example of FIG. 4, power domain 456 includes a variety of peripherals and I/O interfaces 420 that allow external devices to communicate with PS 106 over various industry standard protocols. For example, peripherals and I/O interfaces 420 may include one or more gigabit Ethernet controllers (GbE), one or more Controller Area Network (CAN) and/or CAN-Flexible Data Rate (CAN-FD) controllers, one or more Universal Asynchronous Receiver-Transmitter controllers, one or more I2C controllers, one or more Serial Peripheral Interfaces (SPIs), and one or more direct memory access (DMA) engines. Power domain 456 may also include an on-chip memory 422, interconnect 452, and control circuitry 440. Control circuitry 440 may include clock and reset circuitry (Clk/Rst), a power system (PS) manager, a CoreSight controller for debug and/or trace, and/or watchdog timer and triple timer counter (TTC).

Power domain 458 includes APUs 406, 408, 410, and 412. Each of APUs 406, 408, 410, and 412 may include an L1 cache (not shown). Further, APUs 406, 408, 410, and 412 may share a level-2 (L2) cache 418. Power domain 458 includes peripherals and I/O interfaces 432 that allow external devices to communicate with PS 106 over various industry standard protocols. For example, peripherals and I/O interfaces 432 may include one or more Universal Serial Bus (USB) controllers, one or more Serial AT Attachment (SATA) controllers, one or more Peripheral Component Interconnect Express (PCIe) controllers, and/or one or more Display Port (DP) controllers. Power domain 458 may include a coherency interconnect 454. Power domain 458 may also include one or more GPUs and Serializer/Deserializer (SerDes) circuitry (not shown). Interconnects 452 and 454 are capable of establishing connectivity between the respective circuit blocks illustrated in FIG. 4.

FIG. 4 is provided for purposes of illustration and not limitation. PS 106 may include other circuit blocks not illustrated in FIG. 4. Examples of such circuit blocks include, but are not limited to, one or more interrupt request units (IRQs) and snoop control units (SCUs).

Figure 5:
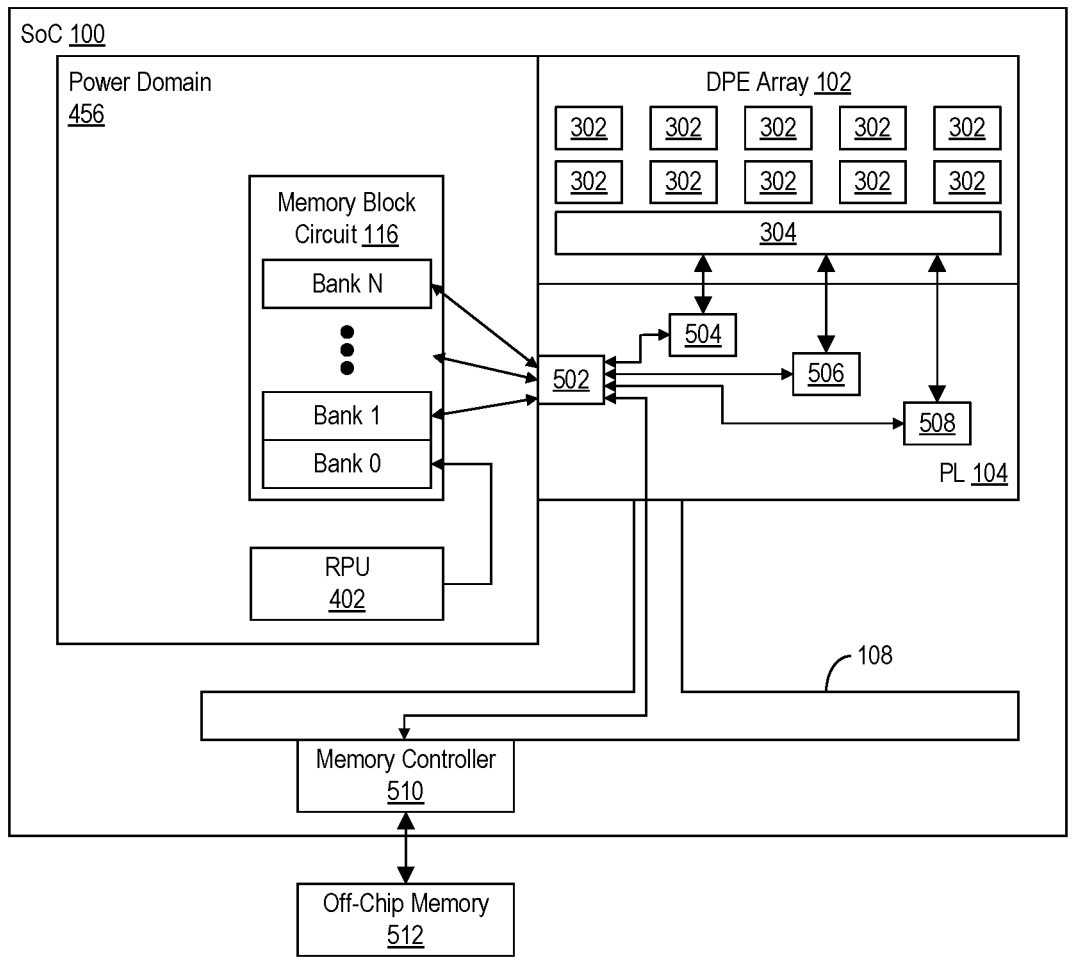
FIG. 5 illustrates example connections between the memory block circuit and other subsystems on the SoC of FIG. 1.

FIG. 5 illustrates example connections between memory block circuit 116 and other subsystems on SoC 100. The example of FIG. 5 shows an example in which memory block circuit 116 is configured to operate as part of PS 106. While memory block circuit 116 may be in the same power domain as RPU 402 in terms of being powered by the same power rails, memory block circuit 116 may be configured to operate as a component of power domain 456 or independently of power domain 456. In the example of FIG. 5, memory block circuit 116 is configured to operate as part of power domain 456.

As illustrated, RPU 402 has a direct connection to memory block circuit 116. In addition, circuits 504, 506, 508 and memory controller 510 couple to circuit 502. Circuits 502, 504, 506, and 508 are implemented in PL 104. In the example of FIG. 5, circuit 502 is directly connected to memory block circuit 116. Each of circuits 504, 506, and 508 is connected to circuit 502 and to DPE array 102 (e.g., by way of SoC interface block 304. Though blocks 504, 506, and 508 are shown to interface with memory block circuit 116 through a single circuit 502, in another aspect, each of blocks 504, 506, and 508 may connect to memory block circuit 116 through their own respective circuits implemented in PL 104.

In the example, memory block circuit 116 includes a plurality of memory banks 0 through N. Each memory bank may be accessed independently and concurrently with respect to the others. For example, memory bank 0 may be accessed by RPU 402, while memory bank 1 is accessed by circuit 504, while another memory bank is accessed by circuit 506, and while memory bank N is accessed by circuit 508. In the example, memory block circuit 116 may serve as a directly connected memory for RPU 402.

In one aspect, memory block circuit 116 is large enough to store the entire code base for RPU 402 therein. As such, RPU 402 may operate faster and with greater efficiency by not having to access off-chip memory 512 via NoC 108 and memory controller 510. In another aspect, memory block circuit 116 may be used to store data that is cached from off-chip memory 512. Memory block circuit 116 may also be used as memory for one or more circuits implemented in PL 104 such as circuits 504, 506, and 508.

As noted, in one aspect, memory block circuit 116 may be implemented in the same power domain as RPUs 402, 404 (e.g., in power domain 456). In that case, power domain 456 may remain powered on (e.g., where power domain 458 is powered down) to utilize memory block circuit 116 even in cases where only PL 104 data paths to memory block circuit 116 are used. The static power expended by power domain 456 is small in comparison with the static power expended by power domain 458 when on. As such, the power domain including PL 104 may be powered down without impacting operation of memory block circuit 116.

In the example of FIG. 5, memory block circuit 116 is coupled to DPE array 102 by way of PL 104. This connectivity generalizes memory block circuit 116 in that PL 104 may access memory block circuit 116 as an interface for other subsystems (e.g., DPE array 102) or access memory block circuit 116 entirely independently of other subsystems of SoC 100. In addition, many applications implemented in DPE array 102, e.g., machine learning applications, use functional blocks implemented in PL 104 to operate in conjunction with DPE array 102, where memory block circuit 116 is used as the storage for those applications in DPE array 102 and/or the functional blocks implemented in PL 104. PL 104 may also be used to aggregate data obtained from interfaces of DPE array 102 and arbitrate between the interfaces of DPE array 102 so that the data may be stored in a centralized storage such as memory block circuit 116.

Figure 6:
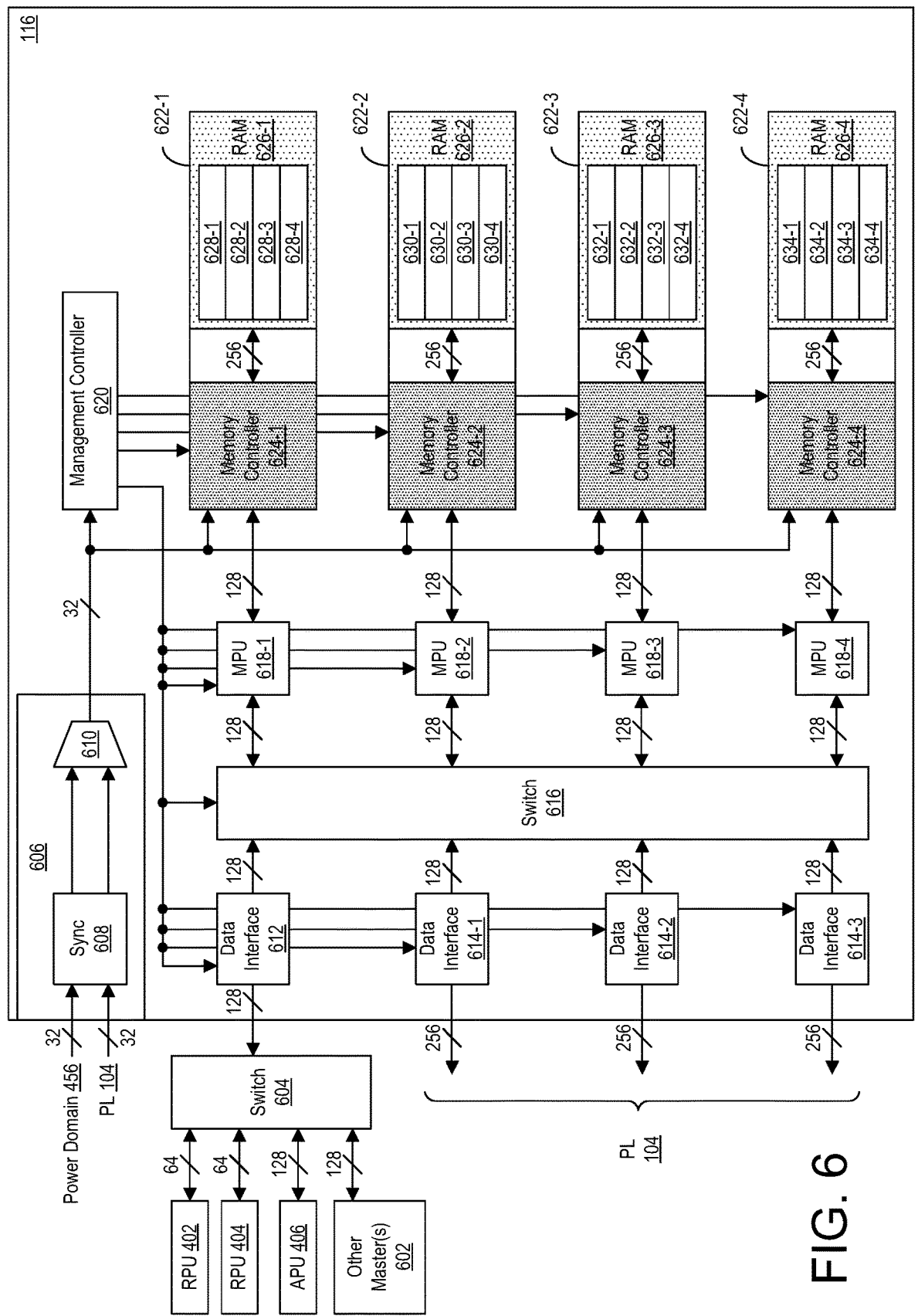
FIG. 6 illustrates an example architecture for a memory block circuit.

FIG. 6 illustrates an example architecture for memory block circuit 116. In the example of FIG. 6, memory block circuit 116 is implemented as a multi-port (e.g., multi-interface) memory that includes multiple memory banks. Memory block circuit 116 may be used exclusively by PL 104, may be used exclusively by PS 106, or shared by PL 104 and by PS 106. In the example, memory block circuit 116 includes a control interface 606; a plurality of data interfaces 612 and 614 (e.g., 614-1, 614-2, and 614-3); a switch 616; a plurality of memory protection units (MPUs) 618 (e.g., 618-1, 618-2, 618-3, and 618-4); a management controller 620; and a plurality of memory banks 622 (e.g., 622-1, 622-2, 622-3, and 622-4).

Memory block circuit 116 generally operates at a first clock rate while PL 104 operates a second and different clock rate. PL 104 is considered a different clock domain than memory block circuit 116. Memory block circuit 116 may operate at the same clock rate as PS 106, but still be considered a different clock domain than PS 106. For example, PS 106 and memory block circuit 116 may have different clock sources (e.g., be asynchronous with respect to one another). The first clock rate is higher than the second clock rate. In one aspect, the first clock rate is a multiple of (e.g., twice) the second clock rate. Thus, while power domain 456 within PS 106 may operate at the same clock rate as memory block circuit 116, PL 104 does not.

For example, referring to FIG. 6, circuitry and signals to the right of synchronization circuit 608 and data interfaces 612 and 614 may operate at the first clock rate as do RPU 402, RPU 404, APU 406, other master circuit(s) 602, and switch 604. PL 104 operates at the second clock rate. PL 104 is capable of connecting to data interfaces 614 with data paths having widths that may be programmed to a multiple of the data path width used within memory block circuit 116.

Control interface 606 includes a synchronization circuit 608 and a multiplexer 610. Power domain 456 (e.g., one of the processors contained therein) is connected to synchronization circuit 608. PL 104 is also connected to synchronization circuit 608. Synchronization circuit 608 is capable of serving as an interface between different clock domains. The two clock domains may have different clock rates or same clock rates. Further the two clock domains may be asynchronous (e.g., have different clock sources or have a same clock source with an arbitrary phase relationship).

In one aspect, synchronization circuit 608 may include two dual-port first-in-first-out (FIFO) memories. One FIFO memory, for example, may have a first port connected to power domain 456 (e.g., clocked by the clock of power domain 456) and a second port connected to a first port of multiplexer 610 (e.g., clocked by the clock of memory block circuit 116). The other FIFO memory may have a first port connected to PL 104 (e.g., clocked by a clock in PL 104) and a second port connected to a second port of multiplexer 610 (e.g., clocked using the clock of memory block circuit 116). Multiplexer 610 may be programmable to pass signals from power domain 456 or from PL 104.

In one aspect, multiplexer 610 is, by default, programmed to select the PS path (power domain 456) for control. In that case, PMC 110 is capable of configuring memory block circuit 116 through the PS path during power up and configuration. Post configuration, multiplexer 610 may be programmed by PMC 110 through the same PS path to select PL 104 as the source. In cases where PMC 110 is to perform a reconfiguration on memory block circuit 116, PMC 110 performs a power-on-reset (POR) to regain control of the path to control interface 606. POR is the highest level of reset for a block in SoC 100 without power-cycling the block and is driven by PMC 110. In another aspect, however, a dedicated register may be included in SoC 100 that is accessible by PMC 110 to control multiplexer 610. In that case, PMC 110 may regain control of control interface 606 without performing a POR on memory block circuit 116.

Data interface 612 is connected to switch 604. Through switch 604, RPU 402 and RPU 404; APU 406; or another master circuit 602 are/is capable of directly connecting to data interface 612. Data interfaces 614 (e.g., 614-1, 614-2, and 614-3) are dedicated to connecting to circuits implemented in PL 104. In the example of FIG. 6, each of data interfaces 614 has a programmable width on the PL 104 side with a maximum width of 256 bits. The connection between switch 604 and data interface 612 has a width of 128 bits. In the example of FIG. 6, each of data interface 612 and data interfaces 614 has a read bus and a write bus of the bit size indicated. For example, each of data interfaces 614 has a read bus of 256 bits and a write bus of 256 bits on the PL 104 side and read bus of 128 bits and a write bus of 128 bits on the opposite side connecting to switch 616. The read and write busses of data interface 612 and data interfaces 614 are capable of operating concurrently and may be maintained through MPUs 618 to the respective memory controllers 624.

In one aspect, each of data interfaces 612 and 614 may be implemented as an Advanced Microcontroller Bus Architecture (AMBA) eXtensible Interface ("AXI interface"). Data interfaces 612 and 614 may be stream interfaces capable of streaming data. Data interfaces 614 may have configurable widths of 32 bits, 64 bits, 128 bits, or 256 bits (e.g., for each bus). Data interfaces 614 are capable of converting signals received from PL 104 from the second clock rate (e.g., second clock frequency) to the first clock rate (e.g., a faster clock rate than received and also referred to herein as the "first clock frequency") and changing the data width to match that of memory block circuit 116 (e.g., 128 bits in this example). As shown, the left side of data interfaces 614 connect to PL 104 with a maximum width of 256 bits while the right side of data interfaces 614 connect to switch 616 with a width of 128 bits. Similarly, data interfaces 614 are capable of converting signals from within memory block circuit 116 to be provided to PL 104 from the first clock rate to the second clock rate and convert the data width from that of memory block circuit 116 to the width used to connect to PL 104.

In the example of FIG. 6, each of data interfaces 614 is independently programmable. In this regard, each data interface 614 may be programmed to operate with a same data width or a different data width. Further, each data interface 612 and 614 may be enabled (e.g., activated) or disabled (e.g., deactivated) depending on the configuration of memory block circuit 116. In one aspect, PMC 110 is capable of programming the widths of data interfaces 614 (where each is independently configurable) and enabling or disabling each of data interfaces 612, 614 independently of the others. In one aspect, programming of the width of data interfaces 614 is performed at POR of memory block circuit 116 and does not change until memory block circuit 116 is again reset or power cycled (e.g., powered on after a power off).

In one aspect, each data interface 612 and 614 may include a synchronization circuit as described in connection with control interface 606 to handle signals crossing from one clock domain to another. In the example of FIG. 6, the synchronization circuits included in data interfaces 612 and 614 may include a single, dual port FIFO memory. In the case of data interface 612, one port of the FIFO memory may connect to switch 604, while the second port connects to switch 616. In the case of data interfaces 614, one port of each FIFO memory connects to PL 104, while the second port of each FIFO memory connects to a port of switch 616.

In another aspect, memory block circuit 116 may be implemented to have a clock that is synchronous with the clock of PS 106 in cases where the PS data path(s) are used. With memory block 116 synchronous with PS 106, the need for synchronizers on the data paths from PS 106 to memory block circuit 116 (e.g., synchronizer 608 and synchronizers in data interface 612) would be eliminated thereby reducing latency from RPU 402 and/or 404 to memory block circuit 116 by one or more clock cycles.

Management controller 620, under control of PMC 110, enables and disables data interfaces 612 and 614. The ability to disable data interfaces 612 and 614 allows management controller 620 to implement functional isolation for memory block circuit 116. Functional isolation refers to the fact that once management controller 620 disables a particular data interface, any circuitry connected to that data interface external to memory block circuit 116 is unable to access any of memory banks 622. As such, by selectively enabling different ones of data interfaces 612, 614, management controller 620 is able to functionally isolate circuits from memory block circuit 116. The ability to disable data interfaces 614 also allows such data interfaces connected to PL 104 to implement the functional isolation without forcing input signals from PL 104 connected to disabled ones of data interfaces 614 to specific values.

Switch 616 connects to each of data interfaces 612 and 614 and to each of MPUs 618 (e.g., 618-1, 618-2, 618-3, and 618-4). In one aspect, switch 616 is implemented as a full cross-bar switch. For example, switch 616 may be implemented as a 4×4 cross-bar interconnect. In one aspect, switch 616 may be a 4×4 cross-bar AXI interconnect. In any case, switch 616 allows concurrent accesses (e.g., 4) to different ones of memory controllers 624 from different data interfaces 612 and 614. Accordingly, each of data interfaces 612, 614-1, 614-2, or 614-3 may be connected, concurrently, to one of MPUs 618-1, 618-2, 618-3, or 618-4 through switch 616. In one aspect, data paths in switch 616 are protected by parity.

In another aspect, switch 616 is configured to provide low latency memory access to RPUs 402, 404. For example, switch 616 may be programmed to provide RPU 402 and/or RPU 404 access to memory banks 622 with greater or higher priority than is given to PL 104 in cases where a conflict arises.

MPUs 618 are operable, once programmed, to protect ingress and egress for each memory controller 624/memory bank 622 combination. For example, each MPU 618 is implemented to monitor the incoming transactions to the circuit and allow only authorized transactions to pass while preventing unauthorized transactions from passing to the memory bank 622 connected thereto. In illustration, each MPU 618 may be programmed by PMC 110 to allow only transactions that have a particular System Management Identifier (SMID) to pass. PMC 110 is capable of assigning a unique SMID to each master circuit in SoC 100. Each master circuit, once defined to use a particular SMID, includes that SMID within each transaction initiated by the master circuit. MPUs 618 are programmed to allow only transactions (e.g., reads and/or writes) that include particular SMIDs. Each MPU 618, being connected to a single and different memory bank, may be programmed to allow transactions from a particular SMID or particular SMIDs.

Each MPU 618 may also be programmed to allow only transactions with a particular SMID that are directed to particular memory addresses within the connected memory bank 622. For example, each MPU 618 may be programmed to allow access to addresses in the connected memory bank 622 on a per SMID basis and only for addresses that are allowed for that SMID. MPUs 618 may be programmed to selectively allow access to memory ranges in the connected memory bank with predetermined granularity. For example, MPUs 618 may check addresses in ranges or increments of 6 KB. It should be appreciated that 6 KB is provided for purposes of illustration and that other ranges or increments may be used instead.

As noted, MPUs 618-1, 618-2, 618-3, and 618-4 are connected to memory banks 622-1, 622-2, 622-3, and 622-4, respectively. Each memory bank 622 includes a memory controller 624 connected to a RAM 626. For purposes of illustration, each RAM 626 may 1 MB in size. Memory bank 622-1 includes memory controller 624-1 and RAM 626-1. Memory bank 622-2 includes memory controller 624-2 and RAM 626-2. Memory bank 622-3 includes memory controller 624-3 connected to RAM 626-3. Memory bank 622-4 includes memory controller 624-4 and RAM 626-4.

Further, each RAM 262 includes multiple power islands. In the example of FIG. 6, each RAM 262 includes four power islands of 256 KB. For example, RAM 626-1 includes power islands 628-1, 628-2, 628-3, and 628-4. RAM 626-2 includes power islands 630-1, 630-2, 630-3, and 630-4. RAM 626-3 includes power islands 632-1, 632-2, 632-3, and 632-4. RAM 626-4 includes power islands 634-1, 634-2, 634-3, and 634-4.

As used herein, the term "power island," means one or more components that are part of a same power domain that are powered on or off by way of a power switch that is within SoC 100. Thus, a power domain may include a plurality of power islands that, when the power rail for the domain is on, may be powered on or off under control of a switch that is on SoC 100 and, in this example, controlled by management controller 620 (e.g., responsive to instructions from PMC 110 during configuration or from PS 106 or PL 104 during operation after configuration). Each power island may be powered on or off independently of the other power islands. Thus, in the example of FIG. 6, each memory bank 622 includes a plurality of power islands. To power down a particular memory bank 622, each power island in that memory bank 622 is powered down.

Management controller 620 is capable of performing operations within memory block circuit 116 such as reset, clock control, functional isolation, power management, protection, and error management. For example, powering down a power island or putting a power island in retention requires a certain sequencing of control signals. Management controller 620 may include state machines that perform this sequencing of signals. The powering down/up/retention, reset (POR or warm reset), and clock gating operations, for example, may be triggered through implemented control registers that are accessible through control interface 606.

In one aspect, management controller 620 is capable of controlling operation of memory banks 622. Management controller 620 is capable of receiving instructions from power domain 656 or from PL 104, depending upon the mode of operation of memory block circuit 116, and controlling operation of memory bank 622 in response to the received instructions during operation. Management controller 620 is capable of initiating any of a variety of power modes within memory block circuit 116 on a per memory bank basis and also on a per power island basis within each of RAMs 626. Examples of power modes include, power on, power off, and data retention.

For example, management controller 620 is capable of powering on and powering off each of memory banks 622 independently subsequent to configuration of memory block circuit 116. Powering off a memory bank 622 means that memory controller 624 and RAM 626 within the memory bank 622 are both powered off, where RAM 626 is powered off when each power island contained therein is powered off. Powering on a memory bank 622 means that memory controller 624 and RAM 626 within the memory bank 622 are both powered on, where RAM 626 is powered on when one or more of the power islands contained therein is powered on. Management controller 620 further may place each of memory banks 622 in a data retention mode independently of the other memory banks 622. While in data retention mode, the memory bank 622 consumes less power. In data retention mode, memory controller 624 and RAM 626 within the memory bank 622 operate to retain data stored in RAM 626, but do not support read or write operations.

Management controller 620 is also capable of performing the power on, power off, and data retention modes described above with respect to memory banks on a per power island basis. Thus, within any memory bank 622 that is powered on, management controller 620 is capable of powering on, powering off, or placing in data retention mode, any of the power islands included in the RAM 626 independently of other power islands in the RAM 626 in any combination.

In the example of FIG. 6, PMC 110, by using PS data paths connected to control interface 606, is capable of configuring data interfaces 614, switch 616, and MPUs 618. PMC 110, for example, may program each of data interfaces 614 to use a particular bit width for connecting to PL 104. The bit width, for example, may be 32, 64, 128, or 256. The bit width of each data path from data interface 614 to PL 104 may be programmed at boot time or after reset of memory block circuit 116 when memory block circuit 116 is configured.

PMC 110 may also program switch 616 to connect the various ports on the data interface side with ports on the MPU side thereby establishing connections between particular communication ports of memory block circuit 116 with particular memory banks 622.

PMC 110 is also capable of programming MPUs 618 with configuration data. For example, PMC 110 is capable of programming each of MPUs 618 with the particular master circuit(s) (e.g., by way of the SMID of each master) that is allowed to submit transactions to the memory bank 622 protected by the respective MPU 618. Further, PMC 110 is capable of programming each MPU 618 with the particular address(es) that may be accessed by each master circuit (e.g., storing a list of allowed addresses and/or address ranges in association with each SMID therein).

As discussed, memory block circuit 116 has a direct connection to PS 106 by way of control interface 606 (and data interface 612). PMC 110 is capable of using the direct connection between memory block circuit 116 and PS 106 (e.g., control interface 606) to configure memory block circuit 116 (e.g., enable and/or disable data interfaces 612, 614; program switch 616; program MPUs 618; power on and/or power off memory banks 622; place particular memory banks 622 in data retention mode; power on and/or off power islands in RAMs 626; and/or place particular power islands in data retention mode). In this manner, PMC 110 is capable of configuring memory block circuit 116 without any reliance on NoC 108 or PL 104. This mechanism is used to initially configure memory block circuit 116.

In another aspect, once memory block circuit 116 is initially configured as described, PL 104 may control memory block circuit 116 via control interface 606 post configuration. Allowing PL 104 to control memory block circuit 116 post configuration may be used in cases where memory block circuit 116 is used primarily (which may or may not mean exclusively) by PL 104 and independently of PS 106. This allows PL 104 to dynamically program and control memory block circuit 116 with respect to powering on or off memory bank 622 and/or particular power islands in RAMs 626.

In still another aspect, memory block circuit 116 is capable of operating in a default configuration without any programming. In that case, memory block circuit 116 is instantiated independently of PS 106. When instantiated independently of PS 106, memory block circuit 116 is not considered "part" of PS 106, but rather part of PL 104. In any case, the default configuration may be loaded by PMC 110 by way of PS 106 data paths and management controller 620.

For example, when memory block circuit 116 is used as a part of PL 104, memory block circuit 116 may be treated like any other component of PL 104. In that case, memory block circuit 116 is fully functional responsive to configuration of PL 104 and does not necessarily need any further programming achieved through a device driver that runs on a processor. Further, PMC 110 performs the programming of memory block circuit 116 through the PS paths before marking PL 104 as configured and ready to use. To a user, SoC 100 operates in such a way that memory block circuit 116 appears available and configured with PL 104.

In the example of FIG. 6, the particular bit widths, clock frequencies, and clock rate ratios provided are for purposes of illustration and not limitation. As such, different bit widths, clock frequencies, and clock ratios may be used in alternative implementations. Further details relating to data transfers into and out from memory block circuit 116 and operation of memory banks 622 are provided below in connection with FIG. 8.

Figure 7:
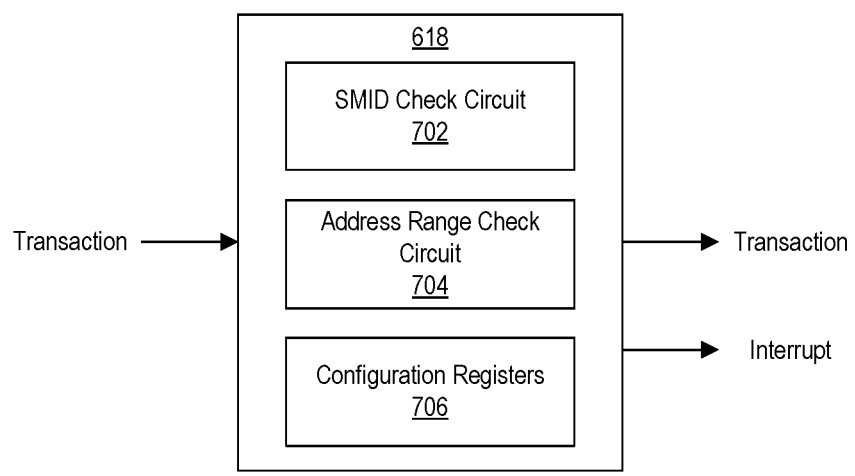
FIG. 7 illustrates an example implementation of a memory protection unit (MPU).

FIG. 7 illustrates an example implementation of an MPU 618 of FIG. 6. MPU 618 includes an SMID check circuit 702, an address range check circuit 704, and configuration registers 706.

SMID check circuit 702 is capable of checking the SMID of a received transaction. SMID check circuit 702 determines the SMID within the received transaction and compares the SMID with a list of allowed SMIDs specified in the configuration registers 706. Address range check circuit 704 determines the particular address(es) that are to be accessed in the destination as specified by the transaction. The address range check circuit 704 checks whether the address(es) specified in the received transaction are within an allowed set or range of addresses for the SMID of the transaction per the configuration registers 706. In one example, address ranges may be specified within MPU 618 with a granularity of 6 KB.

MPU 618 is capable of disallowing (e.g., rejecting) any transaction that does not meet the checks performed by SMID check circuit 702 and address range check circuit 704. MPU 618 is further capable of generating an interrupt signal in response to determining that a received transaction is rejected based on the checks performed by SMID check circuit 702 and/or the address range check circuit 704.

Figure 8A:
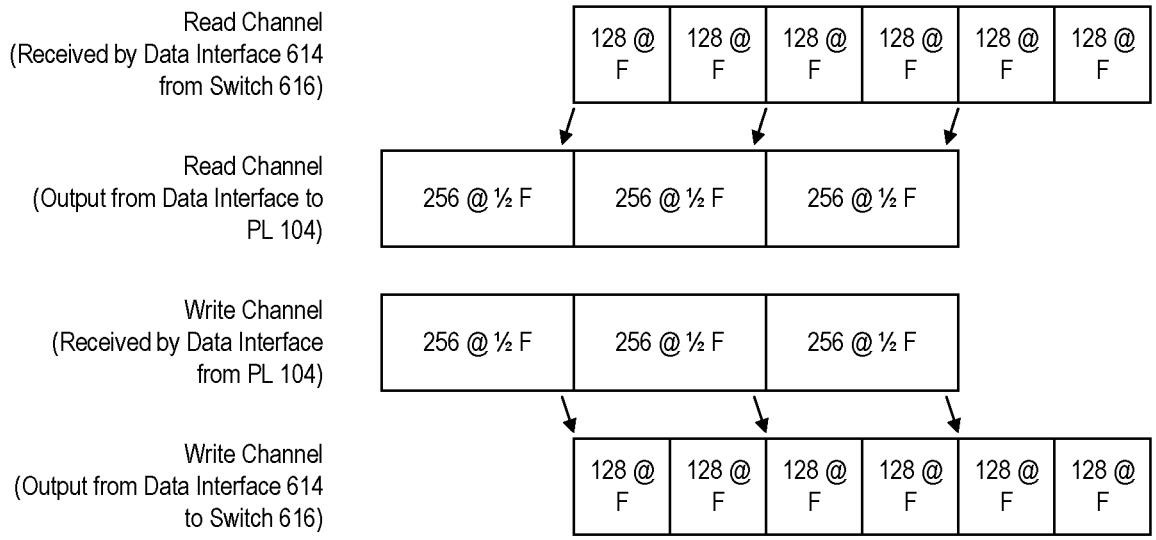
FIGS. 8A and 8B illustrate certain operational aspects of the memory block circuit.
Figure 8B:
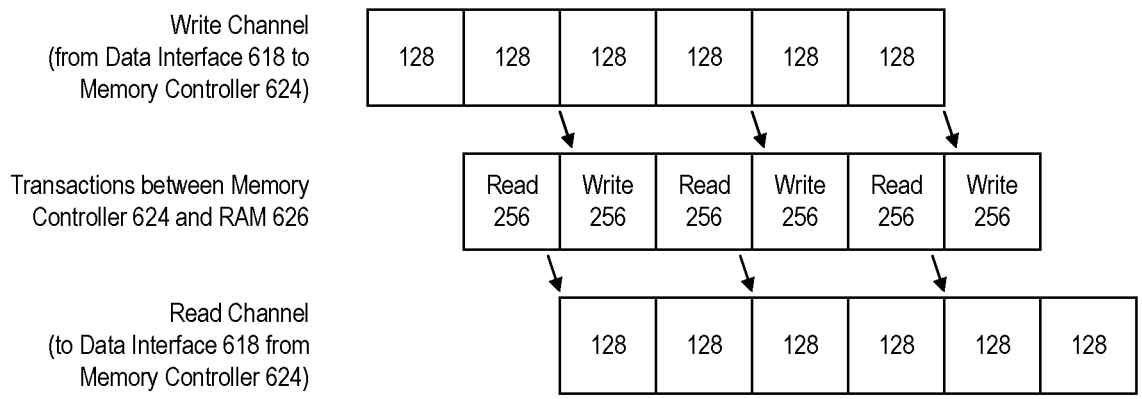

FIGS. 8A and 8B illustrate certain operational aspects of memory block circuit 116. FIG. 8A illustrates example data flows into memory block circuit 116 from PL 104 and out from memory block circuit 116 to PL 104. In general, FIG.

8A illustrates how channels of data interfaces 614 connected to PL 104 are twice as wide and operate at half of the speed compared to channels of data interfaces 614 connected to switch 616. In this manner, data interfaces 614 provide a balanced bandwidth for memory block circuit 116 and memory controllers 624 therein.

In the example of FIG. 8A, the write channel of data interface 614 receives a 256 bit wide data stream at the second clock rate (e.g., second clock frequency) from PL 104 and converts the data stream to a 128 bit wide data stream at the first clock rate (e.g., first clock frequency). Thus, data interface 614 receives the data stream from PL 104 and converts the data stream to one that is one-half the width and twice the frequency of the data stream received from PL 104. Data interface 614 outputs the converted data stream to switch 616.

The read channel of data interface 614 receives a 128 bit wide data stream at the first clock rate (e.g., first clock frequency) from switch 616 and converts the data stream to a 256 bit wide data stream at the second clock rate (e.g., second clock frequency). Thus, data interface 614 receives the data stream from switch 616 and converts the data stream to one that is twice the width and one-half the frequency of the data stream received from switch 616. Data interface 614 outputs the converted data stream to PL 104.

FIG. 8B illustrates example data flows into and out of memory bank 622 of memory block circuit 116. The example of FIG. 8B illustrates the maximum throughput that may be achieved by using the widest data paths available into data interface 614. In the example of FIG. 6, each of data interfaces 612 and 614 is a bidirectional interface. In this regard, data interface 612 supports concurrent read and write operation (e.g., via independent read and write buses), where each of the read bus and the write bus is 128 bits wide. Data interface 614 supports concurrent read and write operation, where each of the read bus and the write bus is 256 bits wide on the PL 104 side and 128 bits wide on the opposite side (though operating at twice the clock rate).

FIG. 8B illustrates how each memory controller 624 is capable of achieving concurrent read and write access using single-ported RAMs 626. Referring to FIG. 6, memory controller 624 is connected to RAM 626 by way of a 256 bit wide data path that operates at the first clock rate. For a write operation, memory controller 624 receives 128 bits of data on each clock beat (e.g., from the write channel of data interface 612 and/or 614 via switch 616 and MPU 618), accumulates 256 bits of data (e.g., every two clock beats), and writes the 256 bits of data to RAM 626 in a single beat.

With respect to reading data, data interface 614 is capable of receiving a 128 bit wide data stream on the read channel from memory controller 624. Memory controller 624 reads 256 bits of data from RAM 626 on a single clock beat and outputs the read data over two clock beats (e.g., 128 bits on each clock beat) to MPU 618.

In this manner, memory controller 626 is capable of performing an operation on each clock beat. The operations alternate between reads and writes. The example of FIG. 0.8 illustrates the case where the data pipeline connecting data interface 614 and a selected memory bank 622 is fully utilized.

Figure 9:
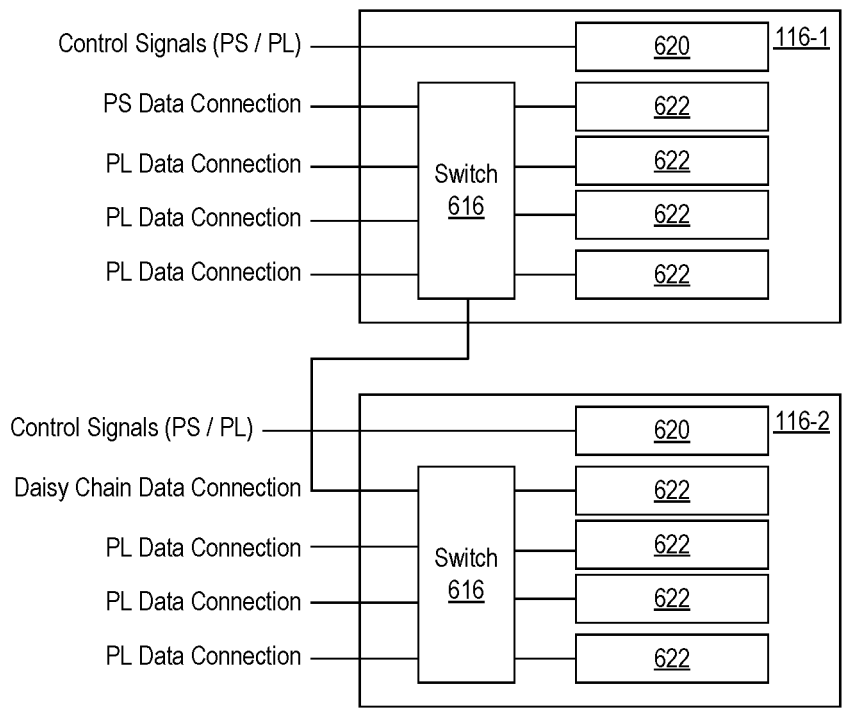
FIG. 9 illustrates an example architecture for daisy chaining memory block circuits.

FIG. 9 illustrates an example architecture for daisy chaining memory block circuits 116. In the example of FIG. 9, two memory block circuits 116 are connected, e.g., daisy chained, to create a larger memory. An IC such as SoC 100 may be implemented to include more than one memory block circuit 116 as described herein. FIG. 9 illustrates one way in which the memory block circuits 116 may be connected.

In the example of FIG. 9, memory block circuit 116-1 is connected to, e.g., daisy chained with, memory block circuit 116-2. By daisy chaining memory block circuits 116-1 and 116-2, the two memory block circuits appear to function as a single, larger memory block circuit. To facilitate daisy-chaining, switch 616 must include an additional slave port so that transactions may be routed to the next switch in the next memory block circuit. The next switch may have a different address mapping in the address space. Also, in the second and follow-on switches, the PS master port may be used to route transactions from the previous switch.

For example, memory block circuits 116-1 and 116-2 may be implemented substantially as described within this disclosure. Switch 616 of memory block circuit 116-1, however, includes an additional slave port supporting two way communication that is connected to the PS master port of switch 616 of memory block circuit 116-2. Within memory block circuit 116-2, rather than connect the PS 106 to switch 616, the data interface otherwise reserved for PS 106 is connected to switch 616 in memory block circuit 116-1, thereby daisy chaining the two memory block circuits 116-1 and 116-2 together.

Accordingly, the PS data connection or the PL data connections of memory block circuit 116-1 may be connected to any of memory banks 622 of memory block circuit 116-1 or to any of memory banks 622 of memory block circuit 116-2 for read and/or write access. Similarly, the PL data connections of memory block circuit 116-2 may be connected to any of memory banks 622 within memory block circuit 116-2 or to any of memory banks 622 of memory block circuit 116-1 for read and/or write access.

Figure 10:
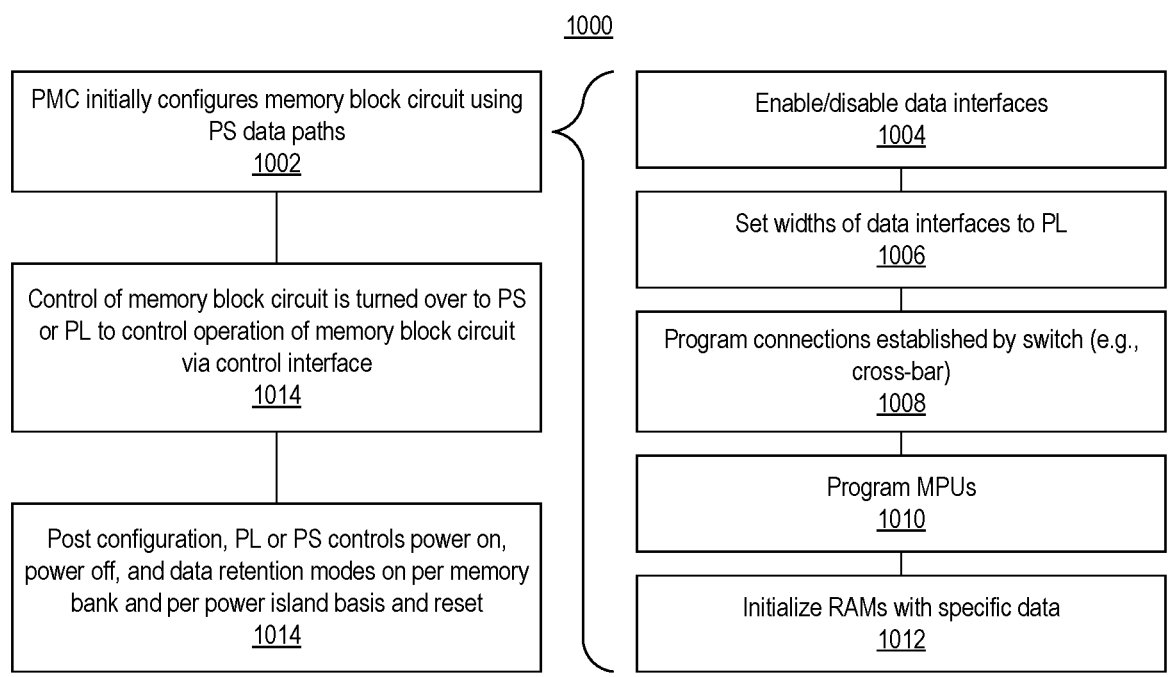
FIG. 10 illustrates an example method of operating a memory block circuit as described within this disclosure.

FIG. 10 illustrates an example method 1000 of operating a memory block circuit 116 as described within this disclosure. Method 1000 may begin in a state where SoC 100 is going through a boot process or memory block circuit 116 has been reset. In block 1002, the PMC 110 initially configures the memory block circuit 116 using PS 106 data paths. PS 106 is directly connected to memory block circuit 116. PMC 110 is capable of using these data paths for purposes of initially configuring memory block circuit 116. PMC 110, for example, may use the direct connections to control interface 606 to instruct management controller 620 to configure the various components of memory block circuit 116.

For example, as part of the initial configuration, in block 1004, PMC 110 is capable of enabling any data interfaces 612, 614 of memory block circuit 116 that are to be used. Similarly, PMC 110 may disable any data interfaces 612, 614 that are not to be used. In block 1006, PMC 110 is capable of setting the widths of data interfaces 614 connecting to PL 104. In one aspect, PMC 110 may only set the widths of those data interfaces that are enabled. In block 1008, PMC 110 is capable of programming connections established by switch 616. In block 1010, PMC 110 is capable of programming MPUs 618. In block 1012, PMC 110 is capable of initializing memory block circuit 116 (e.g., the memory banks and/or RAMs therein) with specific data. Typically, the data that needs to be loaded into memory block circuit 116 is contained within the PDI as a separate segment.

In block 1014, control of memory block circuit 116 is turned over to PS 106 or to PL 104. PS 106 or PL 104, as the case may be, is then able to control operation of memory block circuit 116 via control interface 606 thereof. In block 1016, post configuration, PS 106 or PL 104 is capable of controlling power on, power off, and data retention modes of memory block circuit 116 on a per memory bank 622 basis and on a per power island basis. PS 106 or PL 104 is further capable of initiating a reset of the memory block circuit 116.

Figure 11:
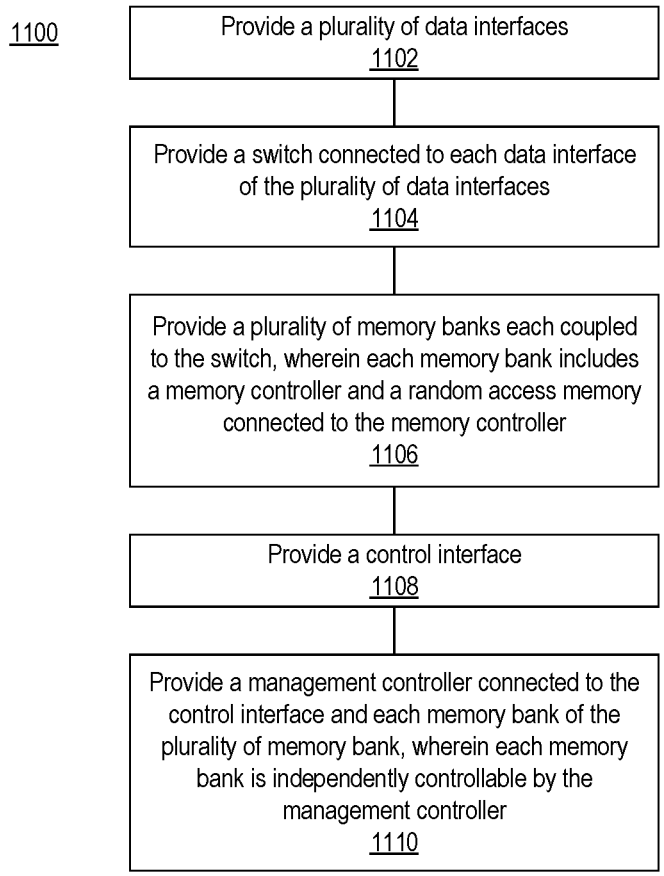
FIG. 11 illustrates an example method of implementing a memory block circuit.

FIG. 11 illustrates an example method 1100 of implementing a memory block circuit. In block 1102, a plurality of data interfaces are provided. In block 1104, a switch connected to each data interface of the plurality of interfaces is provided. In block 1106, a plurality of memory banks, each coupled to the switch are provided. Each memory bank may include a memory controller and a RAM connected to the memory controller. In block 1108, a control interface is provided. In block 1110, a management controller connected to the control interface and to each memory bank of the plurality of memory banks is provided. Each memory bank may be independently controllable by the management controller.

Figure 12:
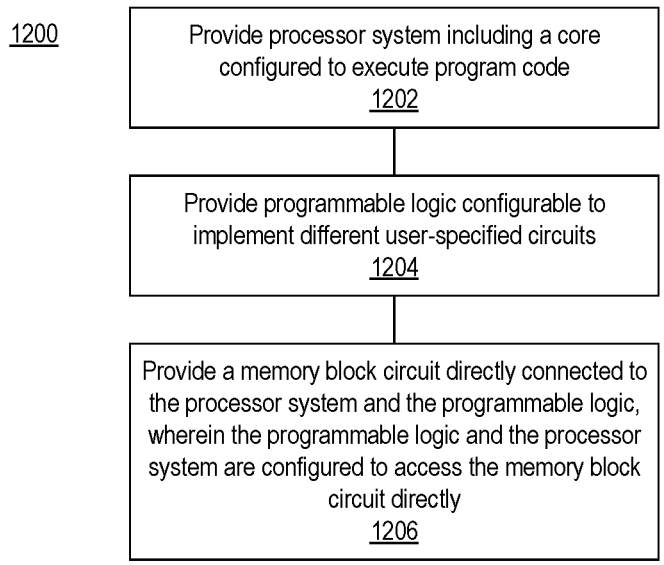
FIG. 12 illustrates an example method of implementing a device.

FIG. 12 illustrates an example method 1200 of implementing a device. In block 1202, a processor system including a core configure to execute program code is provided. In block 1204, a programmable logic that is configurable to implement different user-specified circuits is provided. In block 1206, a memory block circuit directly connected to the processor system and the programmable logic is provided. The programmable logic and the processor system are capable of accessing the memory block circuit concurrently.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the terms "one embodiment," "an embodiment," "one or more embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," and similar language throughout this disclosure may, but do not necessarily, all refer to the same embodiment.

The terms first, second, etc. may be used herein to describe various elements. These elements should not be limited by these terms, as these terms are only used to distinguish one element from another unless stated otherwise or the context clearly indicates otherwise.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems and methods according to various aspects of the inventive arrangements. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A memory block circuit can include a plurality of data interfaces, a switch connected to each data interface of the plurality of data interfaces, and a plurality of memory banks each coupled to the switch. Each memory bank includes a memory controller and a random access memory connected to the memory controller. The memory block circuit also can include a control interface and a management controller. The management controller is connected to the control interface and to each memory bank of the plurality of memory banks. Each memory bank is independently controllable by the management controller.

In another aspect, a selected random access memory in a selected memory bank includes a plurality of power islands.

In another aspect, each power island is independently configurable to implement a selected power mode.

In another aspect, the control interface, the plurality of data interfaces, the switch, the plurality of memory banks, and the management controller operate at a first clock rate that is a multiple of a second clock rate of programmable logic connected to at least one of the plurality of data interfaces.

In another aspect, wherein a width of first data paths connecting a subset of the plurality of data interfaces to circuitry external to the memory block circuit is a multiple of a width of second data paths within the memory block circuit connecting the subset of the plurality of data interfaces to the plurality of memory banks.

In another aspect, for each memory bank of the plurality of memory banks, a width of a third data path connecting the memory controller to the random access memory is twice the width of the second data paths.

In another aspect, the control interface and at least one data interface of the plurality of data interfaces includes a synchronization circuit configured to couple a first clock domain corresponding to the first clock rate within the memory block circuit and a second clock domain corresponding to the second clock rate.

In another aspect, each memory controller is connected to the switch by a memory protection unit configured to selectively grant access to the memory controller based on an identity of a circuit requesting access and an address range to be accessed.

In another aspect, the memory circuit block is disposed within an integrated circuit comprising programmable logic, wherein the programmable logic is connected to a subset of the plurality of data interfaces.

In another aspect, each data interface of the subset of the plurality of data interfaces has a programmable width.

In another aspect, the integrated circuit comprises a processor system connected to at least one of the plurality of interfaces exclusive of the subset of the plurality of interfaces connected to the programmable logic.

In another aspect, the control interface is connected to the processor system.

In another aspect, the control interface is further connected to the programmable logic.

A device can include a processor system having a core configured to execute program code. The device can include a programmable logic configurable to implement different user-specified circuits. The device also can include a memory block circuit directly connected to the processor system and the programmable logic. The programmable logic and the processor system are configured to access the memory block circuit concurrently.

In another aspect, the memory block circuit includes a plurality of data interfaces wherein a first data interface of the plurality of data interfaces is connected to the processor system and a second data interface of the plurality of data interfaces is connected to the programmable logic.

In another aspect, each data interface of the plurality of data interfaces is independently enabled.

In another aspect, the memory block circuit includes a plurality of independently controllable memory banks.

In another aspect, each of the plurality of independently controllable memory banks is accessible from a different one of the plurality of data interfaces concurrently.

In another aspect, each memory bank includes a memory controller and a random access memory connected to the memory controller.

In another aspect, for each memory bank, the random access memory includes a plurality of independently controllable power islands.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A memory block circuit, comprising:
    a plurality of data interfaces;
    a switch connected to each data interface of the plurality of data interfaces;
    a plurality of memory banks each coupled to the switch, wherein each memory bank includes a memory controller and a random access memory connected to the memory controller;
    a control interface;
    a management controller connected to the control interface and each memory bank of the plurality of memory banks, wherein each memory bank is independently controllable by the management controller; and
    wherein each memory controller is connected to the switch by a memory protection unit configured to selectively grant access to the memory controller based on an identity of a circuit requesting access and an address range to be accessed.

2. The memory block circuit of claim 1, wherein a selected random access memory in a selected memory bank includes a plurality of power islands.

3. The memory block circuit of claim 2, wherein each power island is independently configurable to implement a selected power mode.

4. The memory block circuit of claim 1, wherein the control interface, the plurality of data interfaces, the switch, the plurality of memory banks, and the management controller operate at a first clock rate that is a multiple of a second clock rate of programmable logic connected to at least one of the plurality of data interfaces.

5. The memory block circuit of claim 4, wherein a width of first data paths connecting a subset of the plurality of data interfaces to circuitry external to the memory block circuit is a multiple of a width of second data paths within the memory block circuit connecting the subset of the plurality of data interfaces to the plurality of memory banks.

6. The memory block circuit of claim 5, wherein, for each memory bank of the plurality of memory banks, a width of a third data path connecting the memory controller to the random access memory is twice the width of the second data paths.

7. The memory block circuit of claim 4, wherein the control interface and at least one data interface of the plurality of data interfaces includes a synchronization circuit configured to couple a first clock domain corresponding to the first clock rate within the memory block circuit and a second clock domain corresponding to the second clock rate.

8. The memory block circuit of claim 1, wherein the memory circuit block is disposed within an integrated circuit comprising programmable logic, wherein the programmable logic is connected to a subset of the plurality of data interfaces.

9. The memory block circuit of claim 8, wherein each data interface of the subset of the plurality of data interfaces has a programmable width.

10. The memory circuit block of claim 8, wherein the integrated circuit comprises a processor system connected to at least one of the plurality of interfaces exclusive of the subset of the plurality of interfaces connected to the programmable logic.

11. The memory circuit block of claim 10, wherein the control interface is connected to the processor system.

12. The memory circuit block of claim 11, wherein the control interface is further connected to the programmable logic.

13. A device, comprising:
a processor system including a core configured to execute program code;
a programmable logic configurable to implement different user-specified circuits;
a memory block circuit directly connected to the processor system and the programmable logic, wherein the programmable logic and the processor system are configured to access the memory block circuit concurrently; and
wherein the memory block circuit includes a plurality of data interfaces wherein a first data interface of the plurality of data interfaces is connected to the processor system and a second data interface of the plurality of data interfaces is connected to the programmable logic.

14. The device of claim 13, wherein each data interface of the plurality of data interfaces is independently enabled.

15. The device of claim 13, wherein the memory block circuit comprises:
a plurality of independently controllable memory banks.

16. The device of claim 15, wherein each of the plurality of independently controllable memory banks is accessible from a different one of the plurality of data interfaces concurrently.

17. The device of claim 15, wherein each memory bank comprises:
a memory controller and a random access memory connected to the memory controller.

18. The device of claim 17, wherein, for each memory bank, the random access memory includes a plurality of independently controllable power islands.

19. A memory block circuit, comprising:
a plurality of data interfaces;
a switch connected to each data interface of the plurality of data interfaces;
a plurality of memory banks each coupled to the switch, wherein each memory bank includes a memory controller and a random access memory connected to the memory controller;
a control interface;
a management controller connected to the control interface and each memory bank of the plurality of memory banks, wherein each memory bank is independently controllable by the management controller; and
wherein the control interface, the plurality of data interfaces, the switch, the plurality of memory banks, and the management controller operate at a first clock rate that is a multiple of a second clock rate of a programmable logic connected to at least one of the plurality of data interfaces.

20. The memory block circuit of claim 19, wherein the memory block circuit is disposed within an integrated circuit comprising the programmable logic.

* * * * *